(12) United States Patent
Jung et al.

(10) Patent No.: US 9,627,570 B2
(45) Date of Patent: Apr. 18, 2017

(54) DISPLAY SUBSTRATE, METHOD OF MANUFACTURING THE SAME AND TOUCH DISPLAY APPARATUS HAVING THE SAME

(71) Applicant: SAMSUNG DISPLAY CO., LTD., Yongin, Gyeonggi-Do (KR)

(72) Inventors: Suk-Won Jung, Goyang-si (KR); Hyang-Shik Kong, Seongnam-si (KR); Sung-Hoon Yang, Seoul (KR); Sang-Youn Han, Seoul (KR); Kyung-Sook Jeon, Yongin-si (KR); Seung-Mi Seo, Seoul (KR); Mi-Seon Seo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/711,543

(22) Filed: May 13, 2015

(65) Prior Publication Data
US 2015/0243827 A1   Aug. 27, 2015

Related U.S. Application Data

(62) Division of application No. 13/155,227, filed on Jun. 7, 2011, now abandoned.

(30) Foreign Application Priority Data

Dec. 2, 2010  (KR) .................. 10-2010-0121885

(51) Int. Cl.
| | |
|---|---|
| *G06F 3/042* | (2006.01) |
| *G02F 1/1333* | (2006.01) |
| *H01L 31/112* | (2006.01) |
| *H01L 31/167* | (2006.01) |
| *G02F 1/1335* | (2006.01) |
| *G02F 1/1368* | (2006.01) |
| *H01L 27/12* | (2006.01) |

(Continued)

(52) U.S. Cl.
CPC .......... *H01L 31/112* (2013.01); *G02F 1/1368* (2013.01); *G02F 1/13338* (2013.01);
(Continued)

(58) Field of Classification Search
CPC .............................. G06F 3/038; G06F 3/0421
See application file for complete search history.

(56) References Cited

U.S. PATENT DOCUMENTS 7,208,718 B2 * 4/2007 Park ................... G02F 1/1362
250/208.2
7,755,105 B2   7/2010 Honda
(Continued)

FOREIGN PATENT DOCUMENTS

KR   10-2005-0052674 A   6/2005
KR   10-2005-0065971      6/2005
(Continued)

*Primary Examiner* — Lixi C Simpson
(74) *Attorney, Agent, or Firm* — Innovation Counsel LLP

(57) ABSTRACT

A display substrate includes a pixel switching element, a pixel electrode, a reference line, a control switching element, a bias line, a light sensing element, a sensing capacitor and a light blocking filter pattern. The pixel switching element is connected to a data line and a gate line, includes a first semiconductor pattern. The pixel electrode is connected to the pixel switching element. The reference line is in parallel with the data line. The control switching element is connected to the reference line and the gate line, includes a second semiconductor pattern. The bias line is in parallel with the gate line. The light sensing element is connected to the bias line and the control switching element, includes a third semiconductor pattern. The sensing capacitor is connected to the light sensing element and a storage line. The light blocking filter pattern transmits a first light, and blocks a second light.

19 Claims, 33 Drawing Sheets

(51) Int. Cl.
　　*H01L 27/144*　　　(2006.01)
　　*H01L 29/66*　　　　(2006.01)
　　*H01L 27/146*　　　(2006.01)

(52) U.S. Cl.
　　CPC .. *G02F 1/133345* (2013.01); *G02F 1/133512* (2013.01); *G06F 3/0421* (2013.01); *H01L 27/124* (2013.01); *H01L 27/1222* (2013.01); *H01L 27/1255* (2013.01); *H01L 27/1443* (2013.01); *H01L 27/1446* (2013.01); *H01L 29/66765* (2013.01); *H01L 31/167* (2013.01); *H01L 27/14678* (2013.01)

(56) References Cited

U.S. PATENT DOCUMENTS

| | | | |
|---|---|---|---|
| 7,773,078 B2 | 8/2010 | Lee et al. | |
| 7,800,602 B2 | 9/2010 | Choi et al. | |
| 8,058,603 B2 | 11/2011 | Park et al. | |
| 8,427,435 B2 | 4/2013 | Takahashi et al. | |
| 2008/0122803 A1 | 5/2008 | Izadi et al. | |
| 2008/0308802 A1 | 12/2008 | Honda | |
| 2010/0079425 A1* | 4/2010 | Yamazaki | H01L 27/1214 345/206 |
| 2011/0018815 A1 | 1/2011 | Han et al. | |
| 2011/0096021 A1* | 4/2011 | Kim | G02F 1/13338 345/174 |
| 2011/0109592 A1* | 5/2011 | Kurokawa | G06F 3/0412 345/175 |
| 2011/0169772 A1* | 7/2011 | Liu | G06F 3/0412 345/175 |

FOREIGN PATENT DOCUMENTS

| | | |
|---|---|---|
| KR | 10-2008-0109610 | 12/2008 |
| KR | 10-2009-0054073 | 5/2009 |

\* cited by examiner

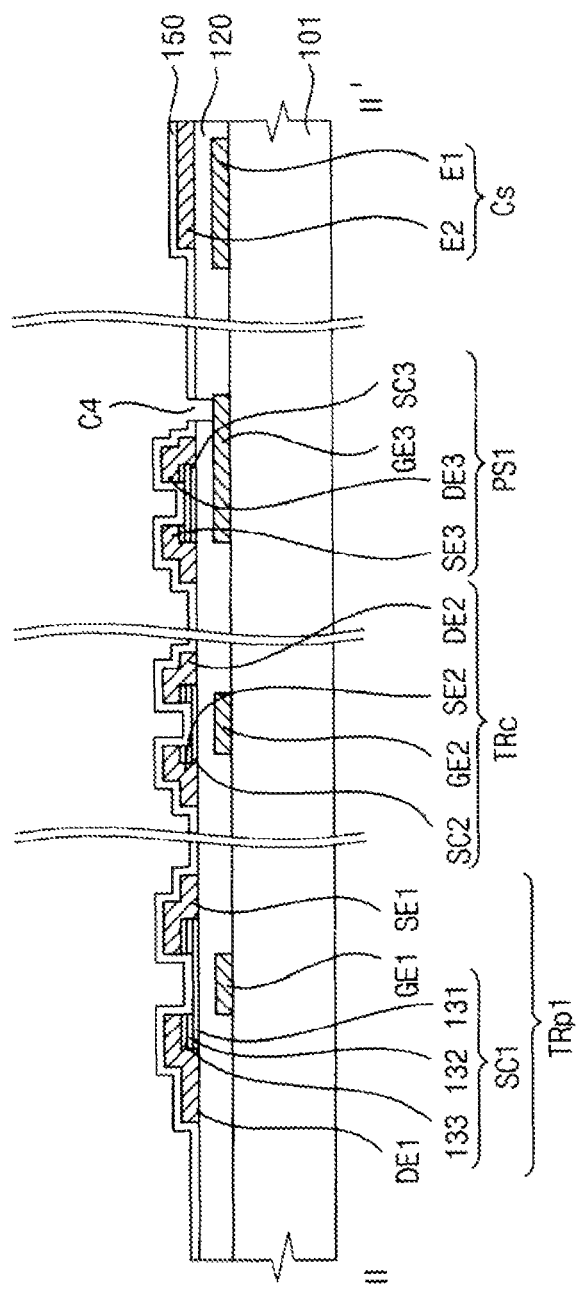

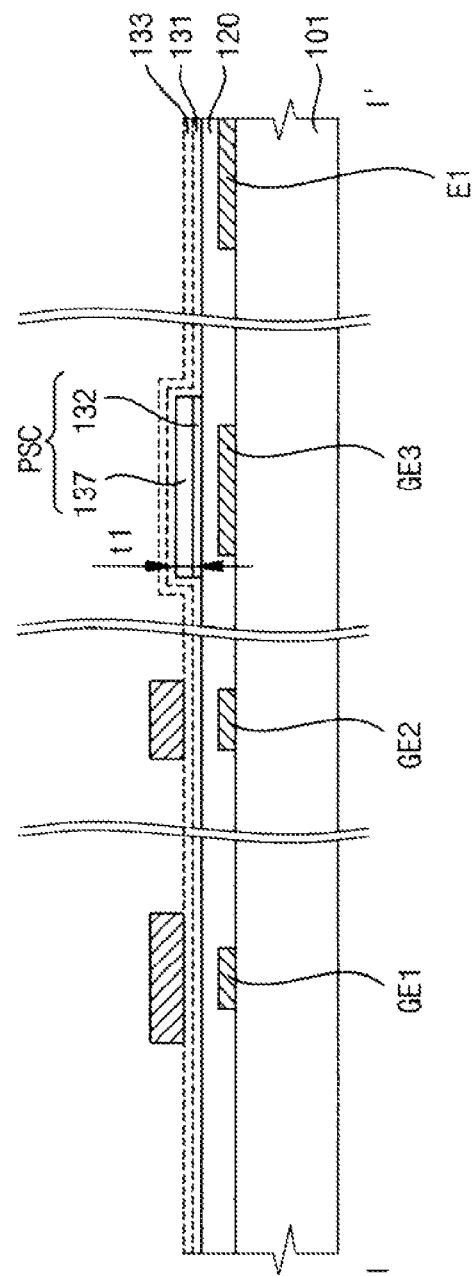

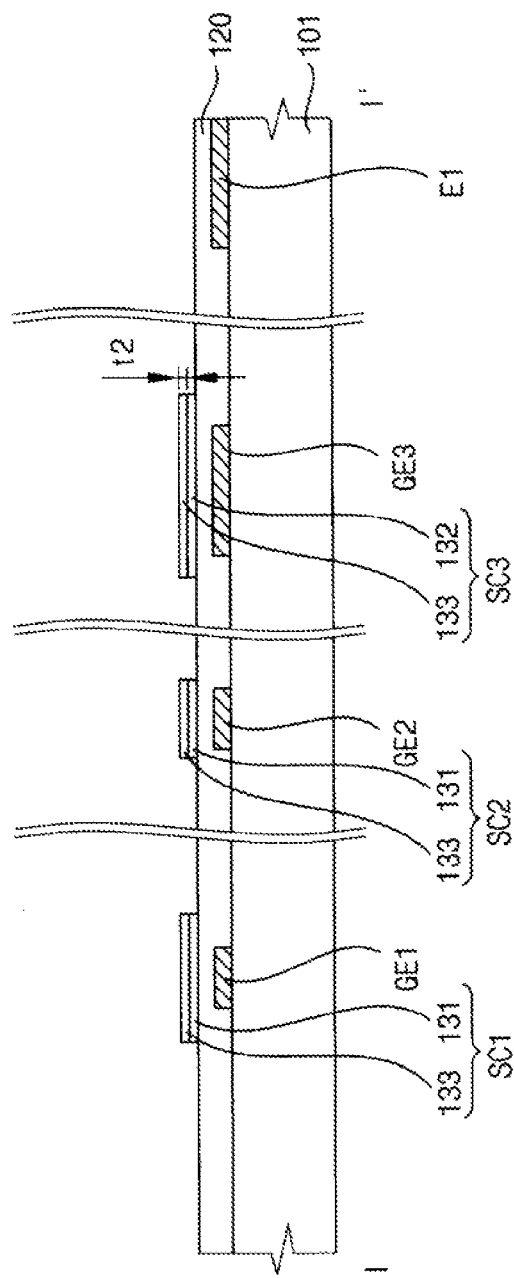

DISPLAY SUBSTRATE, METHOD OF MANUFACTURING THE SAME AND TOUCH DISPLAY APPARATUS HAVING THE SAME

PRIORITY STATEMENT

This application is a divisional application of U.S. patent application Ser. No. 13/155,227 filed on Jun. 7, 2011, which claims priority to Korean Patent Application No. 10-2010-121885, filed on Dec. 2, 2010 in the Korean Intellectual Property Office (KIPO), and all the benefits accruing therefrom under 35 U.S.C. §119, the contents of the prior applications being herein incorporated by reference.

BACKGROUND

1. Field of Disclosure

The present disclosure of invention relates to a display substrate, a method of manufacturing the display substrate, and a touch-detecting display apparatus having the display substrate. More particularly, the present disclosure relates to a display substrate manufactured by a simplified process, a simplified method of manufacturing the display substrate and a touch-detecting display apparatus having the display substrate.

2. Description of Related Technology

Generally, a liquid crystal display (LCD) panel includes a first substrate on which a plurality of thin film transistors (TFTs) are formed and connected to selectively drive corresponding ones of a plurality of pixel areas. The LCD panel also includes a spaced apart second substrate facing the first substrate, and a liquid crystal material layer interposed between the first and second substrates.

Recently, in the field of user interactive LCD panels, touch-detecting display panels have been developed which have a touch-based or alike input function in addition to the function of displaying an image. The typical touch-detecting display panel includes a first substrate on which there are formed a plurality of pixel electrodes for defining the displayed image and a plurality of switching elements (TFTs) connected to respective ones of the pixel electrodes. The typical touch-detecting display panel further includes a spaced apart second substrate on which there is formed a sensing element such as one detecting light and a driving element controlling the sensing element.

When an external touch (e.g., finger engagement) is applied to the touch-detecting display panel, light is caused to be incident upon the sensing element and a flow of photo current is induced within the sensing element by the incident light. A detecting circuit connected to the touch-detecting display panel detects a touch at the position of the light-sensing element by for example using a difference between the detected photo current and a predetermined dark current of the sensing element which latter magnitude is determined before the touch-caused incident light is absorbed.

Since the touch-detecting display panel having these functions of a touch panel and a display panel includes the second substrate on which the active sensing element, the active driving element and signal lines connecting to the sensing element and to the driving element are formed, and the method of manufacturing the touch-detecting display panel is relatively complicated.

It is to be understood that this background of technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Embodiments in accordance with the present disclosure of invention provide a display substrate which can be made with a simplified manufacturing method and thus with decreased manufacturing costs.

Embodiments in accordance with the present disclosure of invention also provide a method of manufacturing the display substrate.

Embodiments in accordance with the present disclosure of invention also provide a touch-detecting display apparatus having the low cost display substrate.

In one embodiment according to the present disclosure, a display substrate includes a pixel switching element, a pixel electrode, a reference line, a control switching element, a bias line, a light sensing element, a sensing capacitor, and a light blocking filter pattern. The pixel switching element is connected to a data line disposed on a base substrate and a gate line crossing the data line, and includes a first semiconductor pattern. The pixel electrode is electrically connected to the pixel switching element. The reference line is formed in parallel with the data line. The control switching element is connected to the reference line and the gate line, and includes a second semiconductor pattern. The bias line is formed in parallel with the gate line. The light sensing element is connected to the bias line and the control switching element, and includes a third semiconductor pattern. The sensing capacitor is connected to the light sensing element and a storage line. The light blocking filter pattern is disposed on the light sensing element and transmits a first light, and is disposed on the data line and gate line and blocks a second light.

In another embodiment according to the present disclosure, a display substrate includes a pixel switching element, a pixel electrode, a reference line, a control switching element, a bias line, a light sensing element, and a sensing capacitor. The pixel switching element is connected to a respective elongated data line and to a respective elongated gate line which crosses with the data line, where the gate line, data line and pixel switching element are formed on a base substrate and where the pixel element includes a first semiconductor pattern. The pixel electrode is electrically connected to the pixel switching element. The reference line extends in parallel with the data line. The control switching element is connected to the reference line and to the gate line, and includes a second semiconductor pattern. The bias line extends in parallel with the gate line. The light sensing element is connected to the bias line and the control switching element, and includes a third semiconductor pattern. A band pass filter is formed substantially on top of the third semiconductor pattern and structured to selectively transmit a prespecified infrared wavelength to the third semiconductor pattern. The sensing capacitor is connected to the light sensing element and to a storage line.

In an embodiment according to the present disclosure, a method of manufacturing a display substrate is provided. In the method, a base substrate is provided, and a gate metal pattern is formed on the base substrate. The gate metal pattern includes a gate line, a first and second gate electrodes connected to the gate line, a bias line, a third gate electrode and a storage line connected to the bias line. A first, a second and a third semiconductor patterns are formed over the first, the second and the third gate electrodes respectively. A source metal pattern is formed on the base substrate on which the first, the second and the third semiconductor patterns are formed. The source metal pattern includes a data line, a first source and drain electrodes overlapping with the first semiconductor pattern, a reference line, second source and drain electrodes overlapping with the second semiconductor pattern, third source and drain electrodes overlapping with the third semiconductor pattern and an electrode partially overlapping with the storage line. A pixel electrode electrically connected to the first drain electrode and a contact electrode electrically connecting the third drain electrode to the storage line, are formed. A light blocking filter pattern transmitting a first light and blocking a second light is formed on areas where the third semiconductor pattern and the data and gate lines are formed.

In another embodiment according to the present disclosure, a method of manufacturing a display substrate is provided. In the method, a gate metal pattern is formed on a base substrate. The gate metal pattern includes a gate line, first and second gate electrodes connected to the gate line, a bias line, a third gate electrode and a storage line connected to the bias line. A first, a second and a third semiconductor patterns are formed over the first, the second and the third gate electrodes respectively. A source metal pattern is formed on the base substrate on which the first, the second and the third semiconductor patterns are formed. The source metal pattern includes a data line, a first source and drain electrodes overlapping with the first semiconductor pattern, a reference line, a second source and drain electrodes overlapping with the second semiconductor pattern, a third source and drain electrodes overlapping with the third semiconductor pattern, and an electrode partially overlapping with the storage line. A pixel electrode electrically connected to the first drain electrode and a contact electrode connecting the third drain electrode to the storage electrode, are formed. An electrically conductive band pass filter overlapping with the third semiconductor pattern and electrically connected to the third gate electrode, where the band pass filter is structured to selectively transmit therethrough an infrared light of predetermined wavelength.

In an embodiment according to the present disclosure, a touch-detecting display apparatus includes a first display substrate, a light blocking filter pattern (BMF pattern), a second display substrate and a liquid crystal material layer. The first display substrate includes a pixel switching element connected to data and gate lines crossing each other and formed on a first base substrate and including a first semiconductor pattern, a pixel electrode electrically connected to the pixel switching element, a reference line elongated in parallel with the data line, a control switching element connected to the reference line and the gate line and including a second semiconductor pattern, a bias line elongated in parallel with the gate line, a light sensing element connected to the bias line and the control switching element and including a third semiconductor pattern, and a sensing capacitor connected to the light sensing element and a storage line. The BMF pattern is disposed over areas of the light sensing element and structured to selectively transmit light of a first predetermined wavelength to the light sensing element, and the light blocking filter pattern being disposed over the data and gate lines and structured to block light of a second predetermined wavelength different from the first wavelength from escaping from areas of the data and gate lines. The second display substrate includes a common electrode disposed on a second base substrate facing the first base substrate. The liquid crystal material layer is interposed between the first display substrate and the second display substrate.

According to the present disclosure, the light sensing element may be used for detecting a touch by user's finger or the like by using a process for forming the pixel switching element and the pixel electrode, and the light sensing element as well as the control switching element all formed on the same display substrate, so that as a result of integrally forming all these elements monolithically on a single substrate, a manufacturing process for producing the panel may be simplified.

BRIEF DESCRIPTION OF THE DRAWINGS

The above and other features and advantages of the present disclosure of invention will become more apparent by describing in detailed embodiments thereof with reference to the accompanying drawings, in which:

FIGS. 9A, 9B, 9C, and 9D are cross-sectional views for explaining a method of manufacturing a first display substrate of FIG. 8;

FIGS. 13A, 13B, 13C, and 13D are cross-sectional views for explaining a method of manufacturing a first display substrate according to still another embodiment;

DETAILED DESCRIPTION

Hereinafter, teachings of the present disclosure will be explained in further detail with reference to the accompanying drawings.

Figure 1:
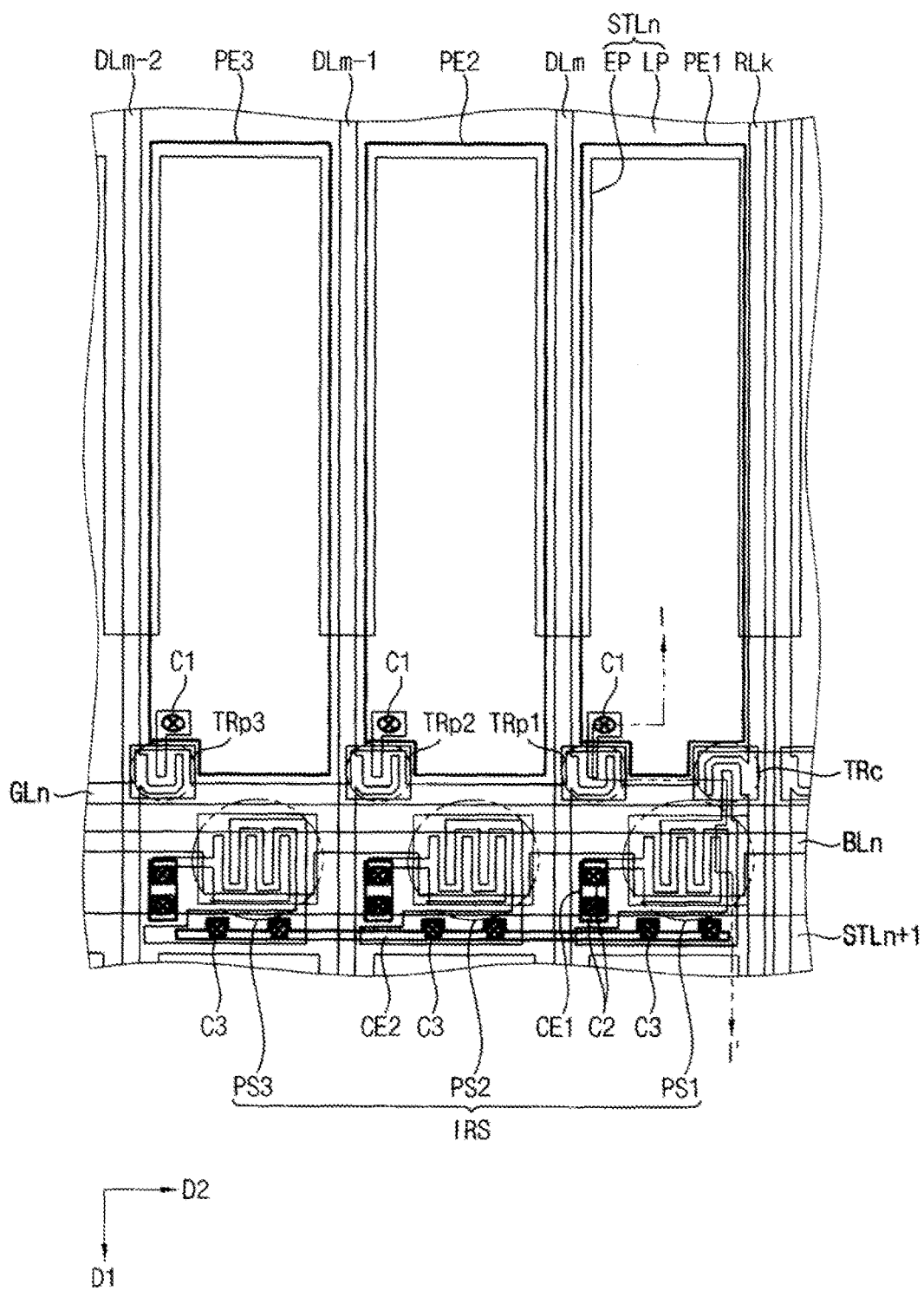
FIG. 1 is a plan view illustrating a repeated section of a touch-detecting display apparatus according to an embodiment in accordance with the present disclosure.
Figure 2:
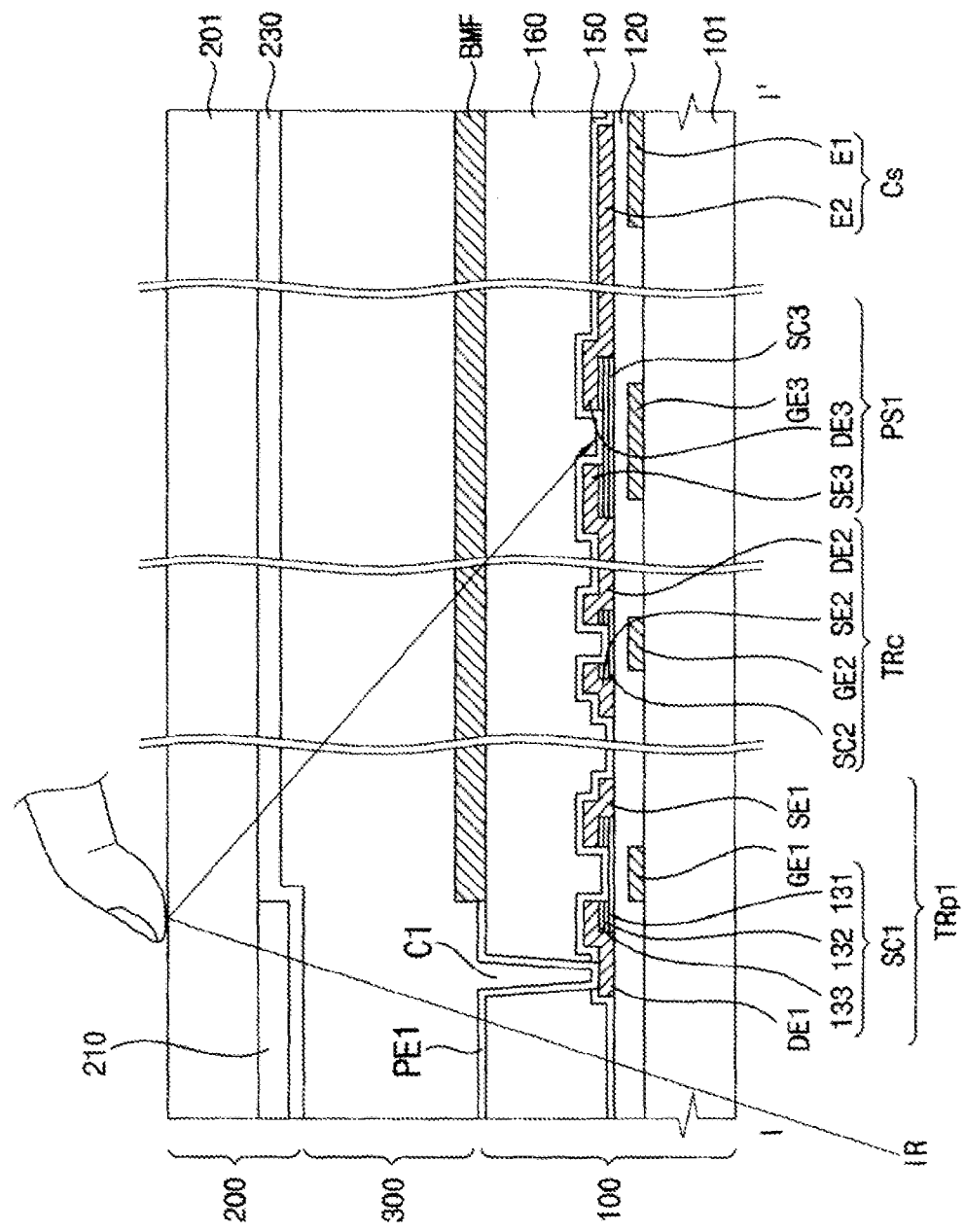
FIG. 2 is a cross-sectional view taken along a line I-I' of FIG. 1.

FIG. 1 is a plan view illustrating a repeated section of a touch-detecting display apparatus according to an embodiment in accordance with the present disclosure. FIG. 2 is a cross-sectional side view taken along a line I-I' of FIG. 1.

Referring FIGS. 1 and 2, the touch-detecting display apparatus includes a first display substrate 100, a second display substrate 200, a liquid crystal material layer 300 interposed between the first and second display substrates 100 and 200.

The first display substrate 100 includes a first base substrate 101, a plurality of data lines DLm-2, DLm-1 and DLm, a plurality of reference lines RLk, a plurality of gate lines GLn, a plurality of bias lines BLn, a plurality of storage lines STLn and STLn+1, a first pixel (or subpixel) switching element TRp1, a first pixel (or subpixel) electrode PE1, a second pixel (or subpixel) switching element TRp2, a second pixel (or subpixel) electrode PE2, a third pixel (or subpixel) switching element TRp3, a third pixel (or subpixel) electrode PE3, a sensor control switching element TRc, an infrared light sensing element IRS, a sensing capacitor Cs and a light blocking filter (BMF: Black Matrix/Band Pass filter) pattern. Here, 'm', 'k', and 'n' are natural numbers.

The data lines DLm-2, DLm-1 and DLm extend in a first direction D1 (vertically in FIG. 1), and are spaced apart along a second direction D2 (horizontal in FIG. 1) crossing with the first direction D1.

The reference lines RLk extend in the first direction D1, and are distributively arranged in spaced apart manner along the second direction D2. The reference lines RLk may be interposed between at least two of the data lines. In one embodiment, a corresponding reference line RLj is provided after every sequence of three pixels or subpixels (e.g., R, G and B subpixels).

The gate lines GLn extend in the second direction D2, and are arranged spaced apart in the first direction D1.

The bias lines BLn extend in the second direction D2, and are arranged spaced apart along the first direction D1. Each of the bias lines BLn may be disposed adjacent to a respective gate line.

The storage lines STLn and STLn+1 include a line part LP extending in the second direction D2, a branch electrode part EP extending in the first direction D1. Respective branch electrode parts EP may be overlapped with corresponding ones of the data lines such as DLm-2, DLm-1 and DLm shown in FIG. 1. The storage branch electrode parts EP may be insulatively spaced apart from each of the respective data lines DLm-2, DLm-1 and DLm while being otherwise disposed adjacent to the respective data lines DLm-2, DLm-1 and DLm.

The first pixel switching element TRp1 includes a first gate electrode GE1, a first semiconductive pattern region (e.g., island) SC1, a first source electrode SE1 and a first drain electrode DE1. The first gate electrode GE1 is connected to an n-th gate line GLn. The first semiconductor pattern SC1 is insulatively disposed over the first gate electrode GE1. The first semiconductor pattern SC1 includes an amorphous silicon (a-Si) layer 131, an amorphous silicon germanium (a-SiGe) layer 132 and an ohmic contact layer 133. The first source electrode SE1 is connected to an M-th data line DLm, and is partially overlapped with the first semiconductor pattern SC1. The first drain electrode DE1 is connected to the first pixel electrode PE1 through a first contact hole C1 and is partially overlapped with the first semiconductor pattern SC1.

The second pixel switching element TRp2 of the second pixel (or subpixel; namely, the one having pixel-electrode PE2) similarly includes a respective first gate electrode GE1, a respective first semiconductor pattern SC1, a first source electrode SE1 and a first drain electrode DE1. The first gate electrode GE1 of the TRp2 element is connected to the same n-th gate line GLn. The respective first semiconductor pattern SC1 is insulatively disposed over a corresponding first gate electrode GE1 which extends as a branch from the n-th gate line GLn. The respective first semiconductor pattern SC1 includes an amorphous silicon (a-Si) layer 131, an amorphous silicon germanium (a-SiGe) layer 132, and an ohmic contact layer 133. The respective first source electrode SE1 of the TRp2 element is connected to an (m−1)-th data line DLm-1, and is partially overlapped with the respective first semiconductor pattern SC1. The respective first drain electrode DE1 is connected to the second pixel electrode PE2 through a first contact hole C1 and is partially overlapped with the first semiconductor pattern SC1.

The third pixel switching element TRp3 of the third pixel (or subpixel; namely, the one having pixel-electrode PE3) similarly includes a first gate electrode GE1, a first semiconductor pattern SC1, a first source electrode SE1 and a first drain electrode DE1. The first gate electrode GE1 is connected to the n-th gate line GLn and the first semiconductor pattern SC1 is disposed over the respective first gate electrode GE1, and the first semiconductor pattern SC1 includes an amorphous silicon (a-Si) layer 131, an amorphous silicon germanium (a-SiGe) layer 132, an ohmic contact layer 133. The first source electrode SE1 is connected to an (m−2)-th data line DLm-2, and is partially overlapped with the first semiconductor pattern SC1. The first drain electrode DE1 is connected to the third pixel electrode PE3 through a respective first contact hole C1 and is partially overlapped with the first semiconductor pattern SC1.

The control switching element TRc includes a respective second gate electrode GE2, a second semiconductor pattern SC2, a second source electrode SE2 and a second drain electrode DE2. The second gate electrode GE2 is connected to the same n-th gate line GLn as are the first through third corresponding pixel switching elements, TRp1-TRp3. The second semiconductor pattern SC2 is disposed over the second gate electrode GE2. The second semiconductor pattern SC2 includes an amorphous silicon (a-Si) layer 131, an amorphous silicon germanium (a-SiGe) layer 132 and an ohmic contact layer 133. The second source electrode SE2 is connected to a reference line RLk, and is partially overlapped with the second semiconductor pattern SC2. The second drain electrode DE2 is connected to the infrared light sensing element IRS and is partially overlapped with the second semiconductor pattern SC2. As an example, the three described pixels of the first display substrate 100 may have respective color filters 210 which cause them to respectively function as a red color pixel region, a green color pixel region and a blue color pixel region. In one embodiment, the control switching element TRc is formed in the area of the blue color pixel region as is the first pixel switching element TRp1. It is within the contemplation of the disclosure to use other or additional colors besides the traditional RGB. For example, a four-colored repeating group populates the display area may have an RGBX configuration where X is White or Cyan. At least one of the color filters should be one that allows infrared (IR) light rays to pass there through.

The infrared light sensing element IRS includes a first light sensor PS1, a second light sensor PS2 and a third light sensor PS3, which are connected to each other, for example in parallel. The first, the second and the third light sensor PS1, PS2 and PS3 are distributively arranged along the second direction D2 in a horizontally extending area adjacent to the n-th gate line GLn.

The first light sensor PS1 includes a third gate electrode GE3, a third semiconductor pattern SC3, a third source electrode SE3 and a third drain electrode DE3. The third gate electrode GE3 is connected to an n-th bias line BLn. The third semiconductor pattern SC3 is disposed over the third gate electrode GE3, and includes an amorphous silicon (a-Si) layer 131, an amorphous silicon germanium (a-SiGe) layer 132, and an ohmic contact layer 133. The third source electrode SE3 is connected to the second drain electrode DE2 of the control switching element TRc. The third drain electrode DE3 is connected to a first contact electrode CE1 through second contact holes C2 to make connection with the storage line STLn+1.

The second light sensor PS2 includes a respective third gate electrode GE3, a third semiconductor pattern SC3, a third source electrode SE3 and a third drain electrode DE3. The third gate electrode GE3 is connected to the n-th bias line BLn. The third semiconductor pattern SC3 is disposed over its respective third gate electrode GE3, and includes an amorphous silicon (a-Si) layer 131, an amorphous silicon germanium (a-SiGe) layer 132, and an ohmic contact layer 133. The third source electrode SE3 is connected to the second contact electrode CE2 by connecting to the third source electrode SE3 of the first light sensor PS1 by way of third contact holes C3. The third drain electrode DE3 is connected to the first contact electrode CE1 through the second contact holes C2 to make connection with the storage line STLn+1.

The third light sensor PS3 includes a third gate electrode GE3, a third semiconductor pattern SC3, a third source electrode SE3 and a third drain electrode DE3. The third gate electrode GE3 is connected to the n-th bias line BLn. The third semiconductor pattern SC3 is disposed over the third gate electrode GE3, and includes an amorphous silicon (a-Si) layer 131, an amorphous silicon germanium (a-SiGe) layer 132, and an ohmic contact layer 133. The third source electrode SE3 is connected to the second contact electrode CE2 by way of connection to the third source electrode SE3 of the first light sensor PS1 and by way of third contact holes C3. The third drain electrode DE3 is connected to the first contact electrode CE1 through the second contact holes C2 to make connection with the storage line STLn+1.

Thus, the gate electrodes GE3 of the first, the second and the third light sensors PS1, PS2 and PS3 are connected to the n-th bias line BLn, the third source electrodes SE3 are connected to the second drain electrode DE2 of the control switching element TRc through the second contact electrode CE2, and the third drain electrodes DE3 are connected to the storage line STLn+1 through the first contact electrode CE1.

The sensing capacitor Cs includes a first electrode (capacitor plate) connected to or formed by a portion (LP) of the storage line STLn+1. The sensing capacitor Cs includes a second electrode E2 (capacitor plate) connected to an output electrode of the infrared sensing element IRS, which is a second electrode E2 is also connected to the third drain electrode DE3 of the first light sensor PS1.

The light blocking filter pattern BMF is disposed on an area on which a metal pattern is formed, and functions as a visible light blocking pattern (for example, Black-Matrix: BM) to thus block visible light rays from substantially passing through. Furthermore, the light blocking filter pattern BMF is disposed on an area over which the third semiconductor pattern SC3 of the infrared light sensing element is formed, and functions as a band pass filter (BPF) to transmit a light having a predetermined wavelength to which the light sensor (IRS) is sensitive, for example, an infrared wavelength light.

For example, the light blocking filter pattern BMF is disposed on an area on which the data lines DLm-2, DLm-1 and DLm, the gate lines GLn, the pixel switching elements TRp1, TRp2 and TRp3, the control switching element TRc and the light sensors PS1, PS2 and PS3 are formed.

When an infrared light IR generated from under the touch-detecting display apparatus is reflected by an outer reflecting substance (e.g., a user's finger tip) being touched on a surface of the touch-detecting display apparatus, and then this reflected IR light incident to the third semiconductor pattern SC3 of the infrared light sensing element IRS, a photo current is induced to flow through the infrared light sensing element IRS, thereby reducing (discharging) a voltage stored by the sensing capacitor Cs and changing a voltage that will detected on the reference line RLk when Trc is switched into a conductive mode. Accordingly, the infrared light sensing element IRS can be used to determine a touch position (by an IR reflecting object such a finger) based on a detected flow of photo current.

The second display substrate 200 includes a second base substrate 201, a color filter layer 210 and a common electrode 230.

The second base substrate 201 is spaced apart from and faces the first base substrate 101.

The color filter layer 210 is disposed on the second base substrate 201. The color filter layer 210 may include a red color filter, a green color filter and a blue color filter, and optionally in addition, a multi-primary filter like a yellow color filter (red and green combined), a cyan color filter, a magenta color filter, or a white light passing filter, and so on. Each of the differently colored color filters may be disposed on the second base substrate 201 corresponding to the light controlling pixel electrode disposed on the first display substrate 100. For example, a red filter may be disposed on the second base substrate 201 corresponding to an area under which the third pixel electrode PE3 is formed, a green filter may be disposed on the second base substrate 201 corresponding to an area under which the second pixel electrode PE2 is formed, and a blue filter may be disposed on the second base substrate 201 corresponding to an area under which the first pixel electrode PE1 is formed.

The common electrode 230 is disposed on the color filter layer 210. The common electrode 230 may include a transparent conductive material (e.g., ITO or IZO).

In the present embodiment, the color filter layer 210 is included on the second display substrate 200. Alternately, the color filter layer 210 may be disposed on the first display substrate 100. In this case, an organic insulating layer 160 of the first display substrate 100 may be replaced by the color filter layer 210.

Figure 3:
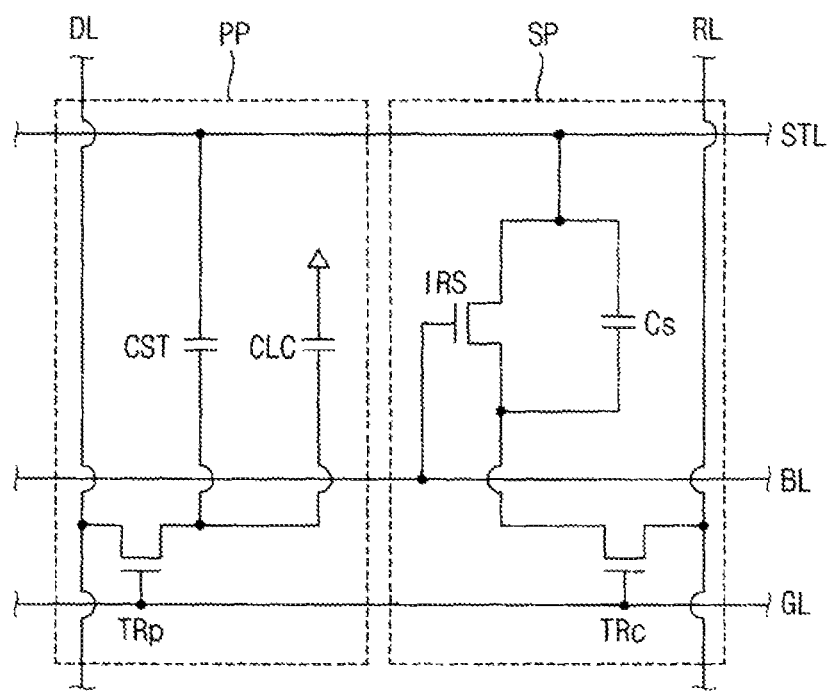
FIG. 3 is an equivalent circuit diagram illustrating the touch-detecting display apparatus of FIG. 1.

FIG. 3 is an equivalent circuit diagram illustrating the touch-detecting display apparatus of FIG. 1.

Referring FIGS. 1 and 3, the touch-detecting display apparatus includes pixel units PP and an IR sensing part SP.

The pixel units PP include a data line DL, a gate line GL, a storage line STL, a first pixel switching element TRp1, a storage capacitor Cst and a liquid crystal capacitor Clc. The pixel switching element is connected to the gate line GL, the data line DL and the liquid crystal capacitor Clc, and a common voltage Vcom is applied to the storage line STL.

When a high-leveled gate signal ($V_{gON}$) is applied to the gate line, the first pixel switching element TRp1 is turned on so that a data voltage applied to the data line DL is delivered to the liquid crystal capacitor Clc. The liquid crystal capacitor Clc is charged with a charge corresponding to the difference between the data line voltage and the common voltage Vcom while the gate signal is at the high level ($V_{gON}$). Furthermore, the storage capacitor Cst is connected to the liquid crystal capacitor Clc, and is charged with the data voltage. The storage capacitor Cst is thus similarly charged with a charge corresponding to the difference between the data voltage and the common voltage Vcom and substantially retains this voltage until the next pixel refresh cycle when a new gate signal pulse having a high level is applied to the gate line GL in a following frame period.

The sensing part SP includes a reference line RL, the gate line GL, a bias line BL, the storage line STL, a control switching element TRc, an infrared light sensing element IRS and a sensing capacitor Cs. The control switching element TRc is connected to the reference line RL, the gate line GL and a source electrode of the infrared light sensing element IRS. A reference voltage Vref may be applied to the reference line RL uniformly, a bias voltage Vb is applied to the bias line BL, and the bias voltage Vb may be always a turning off biasing-voltage (subthreshold) uniformly as a control voltage of the infrared light sensing element IRS when it is in a reflected light sensing mode.

A gate electrode of the infrared light sensing element IRS is connected to the bias line BL, the source electrode of the infrared light sensing element IRS is connected to a drain electrode of the control switching element TRc, and a drain electrode of the infrared light sensing element IRS is connected to the storage line STL. A first electrode of the sensing capacitor Cs is connected to the drain electrode of the control switching element TRc, and a second electrode of the sensing capacitor Cs is connected to the storage line STL.

When a high-leveled gate signal is applied to the gate line GL, the control switching element TRc is turned on so that the reference voltage Vref applied to the reference line RL and the common voltage Vcom applied to the storage line STL are applied across the sensing capacitor Cs. The sensing capacitor Cs is thus initially charged with a charge corresponding to the difference between the reference voltage Vref and the common voltage Vcom.

When a low-leveled gate signal is applied to the gate line GL, the control switching element TRc is turned off. While the control switching element TRc is turned off, when an infrared light is received by the infrared light sensing element IRS by touching, the infrared light sensing element IRS is activated and it becomes conductive. Therefore, a photo current flows and discharges the sensing capacitor Cs. In other words, a decrease in stored voltage is caused at the second electrode of sensing capacitor Cs to which the reference voltage Vref was originally applied. Alternatively, when touching does not occur so that an infrared light is not received by the infrared light sensing element IRS, the sensing capacitor Cs does not discharge.

Thereafter, when a next high-leveled gate pulsing signal is applied to the gate line GL during a following frame, the control switching element TRc is again turned on. At the start of the next gate line activating pulse ($V_{gON}$), the control switching element TRc is again turned on and a rush of current flows through it (and through the reference line RL) for recharging the discharged sensing capacitor Cs. The current is that needed to recharge the sensing capacitor Cs back to the level of the reference voltage Vref and the recharge current is delivered through the reference line RL. In other words, during the recharge time, a magnitude of current flows according to an RC charge curve through the reference line RL. Therefore a current flow detecting circuit (e.g., having a current sensing resistance or capacitance; not shown) connected to an end of the reference line can detect the magnitude of current initially flowing through the reference line at the start of the next gate line activating pulse ($V_{gON}$) and it thus can recognize an outer touch.

FIG. 4A to FIG. 4D are cross-sectional views for explaining a method of manufacturing the first display substrate of FIG. 2. FIG. 5 is a graph illustrating a characteristic of the light blocking filter pattern BMF of FIG. 2.

Figure 4A:
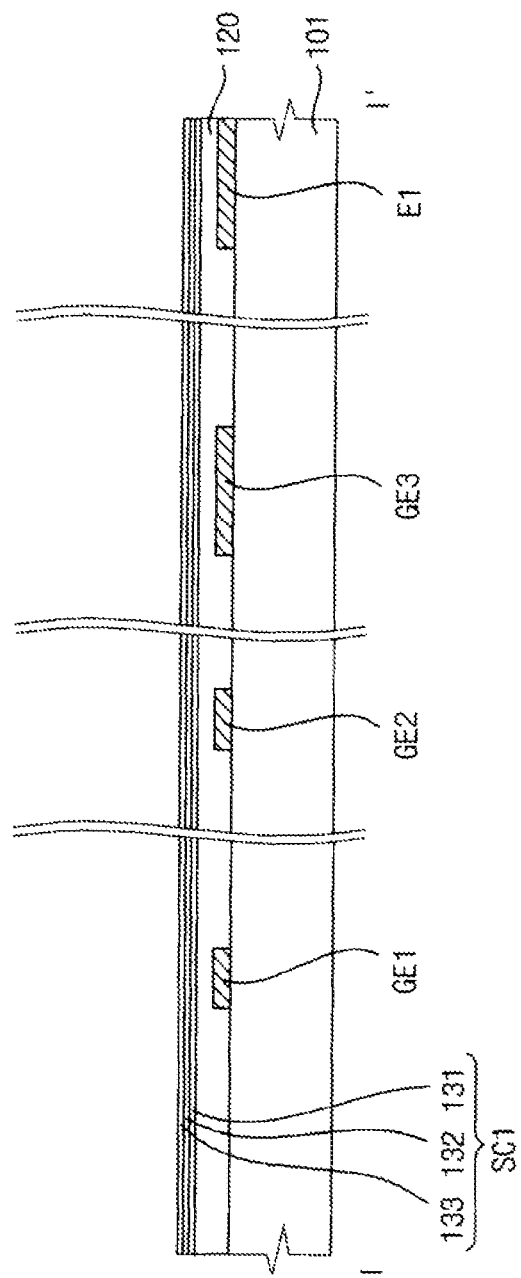
FIGS. 4A, 4B, 4C, and 4D are cross-sectional views for explaining a method of manufacturing a first display substrate of FIG. 2.
Figure 5:
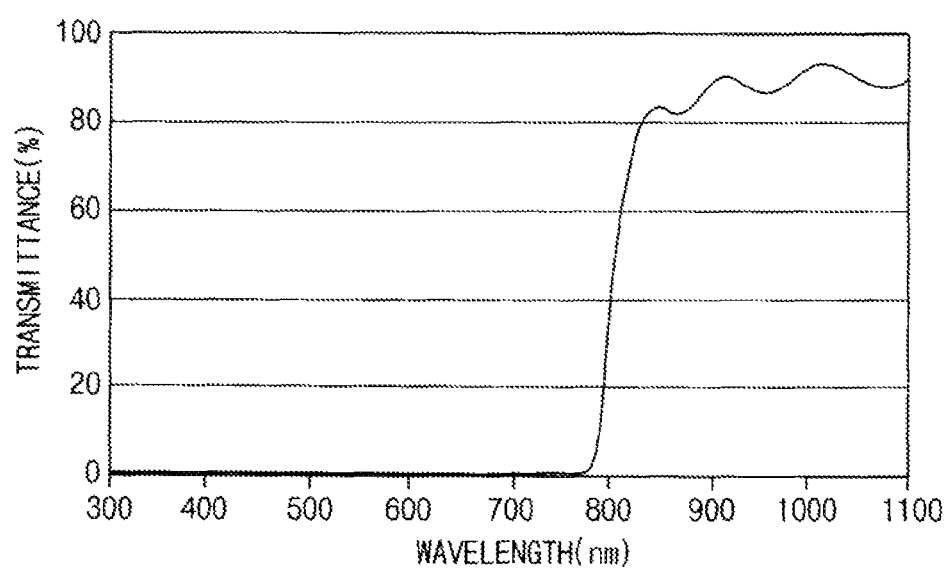
FIG. 5 is a graph illustrating a characteristic of a light blocking filter pattern of FIG. 2.

Referring FIGS. 1 and 4A, a gate metal layer is formed on the first base substrate 101.

The gate metal layer is patterned to form a gate metal pattern by using a photoresist pattern or other appropriate photolithographic means. The patterned gate metal layer includes gate lines GLn, storage lines STLn and STLn+1, bias lines BLn, a first gate electrode GE1, a second gate electrode GE2 and a third gate electrode GE3. The gate lines GLn and the bias lines BLn extend in the second direction D2, and may be disposed adjacent to each other. Each of storage lines STLn and STLn+1 includes a line part LP extending in the second direction D2 and an electrode part EP extending in the first direction D1 from the line part LP. The line part LP defines a first electrode E1 of the sensing capacitor Cs. The first and the second gate electrodes GE1 and GE2 protrude from the gate line GLn, the third gate electrodes GE3 protrude from the bias line BLn. The third gate electrode GE3 may protrude in a direction opposite to a protruding direction of the first gate electrode and the second gate electrode GE1 and GE2.

A gate insulating layer 120 is thereafter deposited on the patterned gate metal layer. Examples of a material that may be used for the gate insulating layer 120 may include a silicon oxide (SiOx) and/or a silicon nitride (SiNy).

A semiconductive layer 130 is thereafter disposed on the first base substrate 101 on which the gate insulating layer 120 is formed. The semiconductor layer 130 includes an amorphous silicon (a-Si) layer 131, an amorphous silicon germanium (a-SiGe) layer 132, and an ohmic contact layer 133. The ohmic contact layer 133 may include amorphous silicon doped with n+ dopants (e.g., ion implanted).

The semiconductor layer 130 is thereafter patterned by for example using a photoresist pattern so that a first semiconductor pattern SC1, a second semiconductor pattern SC2 and a third semiconductor pattern SC3 is formed. The first semiconductor pattern SC1 is disposed over the first gate electrode GE1, the second semiconductor pattern SC2 is disposed over the second gate electrode GE2, and the third semiconductor pattern SC3 is disposed over the third gate electrode GE3.

Figure 4B:
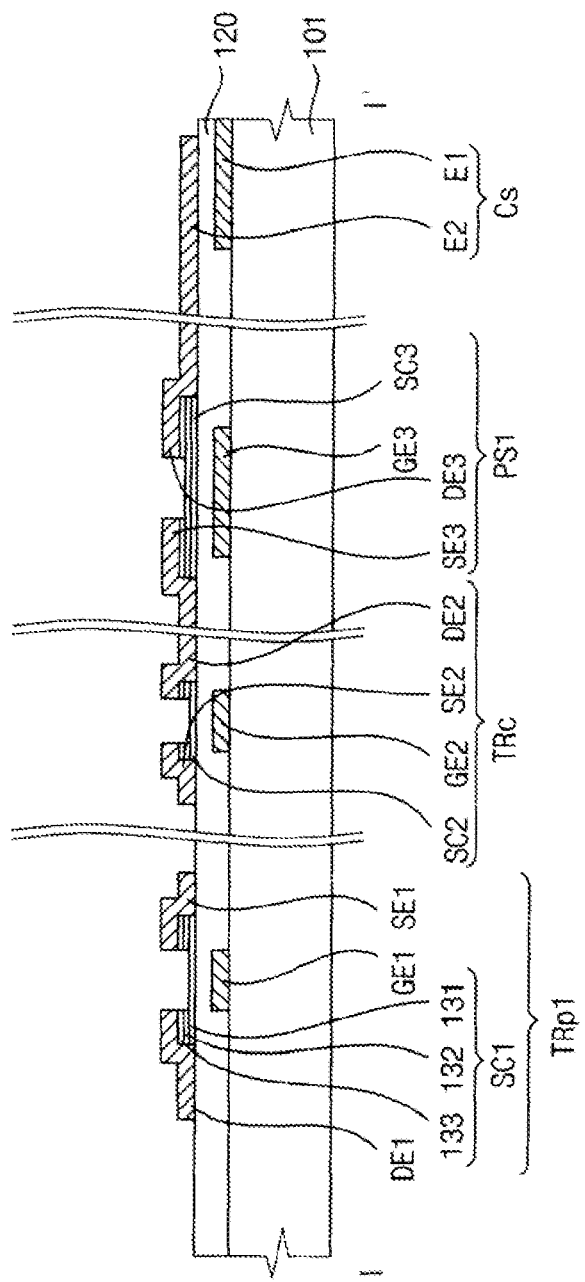

Referring FIGS. 1 and 4B, a source metal layer is thereafter disposed on the first base substrate 101 on which the first, the second and the third semiconductor patterns SC1, SC2 and SC3 are formed. The source metal layer is patterned to form a patterned source metal layer by for example using a corresponding photoresist pattern. The patterned source metal layer includes data lines DLm, DLm-1 and DLm-2, reference lines RLk, a first source electrode SE1, a first drain electrode DE1, a second source electrode SE2, a second drain electrode DE2, a third source electrode SE3, a third drain electrode DE3 and a second electrode E2 of the sensing capacitor Cs.

The data lines DLm, DLm-1 and DLm-2 and the reference lines RLk are extending in the first direction D1, and are arranged as spaced apart in the second direction D2. For example, several data lines may be disposed between two successive reference lines RLk. The first source electrode SE1 is partially overlapped with the first semiconductor pattern SC1, the first drain electrode DE1 is spaced apart from the first source electrode SE1, and is partially overlapped with the first semiconductor pattern SC1. The second source electrode SE2 is partially overlapped with the second semiconductor pattern SC2, the second drain electrode DE2 is spaced apart from the second source electrode SE2, and is partially overlapped with the second semiconductor pattern SC2. The third source electrode SE3 is partially overlapped with the third semiconductor pattern SC3, the third drain electrode DE3 is spaced apart from the third source electrode SE3, and is partially overlapped with the third semiconductor pattern SC3. A second electrode E2 of the sensing capacitor Cs is partially overlapped with a line part LP of the storage line STLn+1. Therefore, the line part LP overlapped with the second electrode may define the first electrode E1 of the sensing capacitor Cs.

Thereafter, the first, the second and the third semiconductor patterns SC1, SC2 and SC3 are etched by using as self-aligning etch masks, the first, the second and the third source electrodes SE1, SE2 and SE3 and the first, the second and the third drain electrodes DE1, DE2 and DE3. First of all, the ohmic contact layer 133 that is an upper layer of the first, the second and the third semiconductor patterns SC1, SC2 and SC3 is selectively etched. And then, the amorphous silicon germanium (a-SiGe) layer 132 of the first and the second semiconductor patterns SC1 and SC2 is selectively etched under a different etching condition.

Therefore, the amorphous silicon (a-Si) layer 131 is exposed at the first and the second semiconductor patterns SC1 and SC2 and the amorphous silicon germanium (a-SiGe) layer 132 is exposed at the third semiconductor pattern SC3. Accordingly, there are formed a pixel switching element TRp1 and a control switching element TRc that should have excellent characteristics in an on/off ratio and a reliability where these use the amorphous silicon (a-Si) layer 131 as a back channel that is insulatively spaced close to the lower gate electrode (GE1). Also formed is the infrared light sensing element IRS that should have excellent characteristics in ratio of a photo current Iph, when a light is incident versus its dark current Idark, when a light is blocked, and this infrared light sensing element IRS may use the amorphous silicon germanium (a-SiGe) layer 132 as its back channel.

Figure 4C:
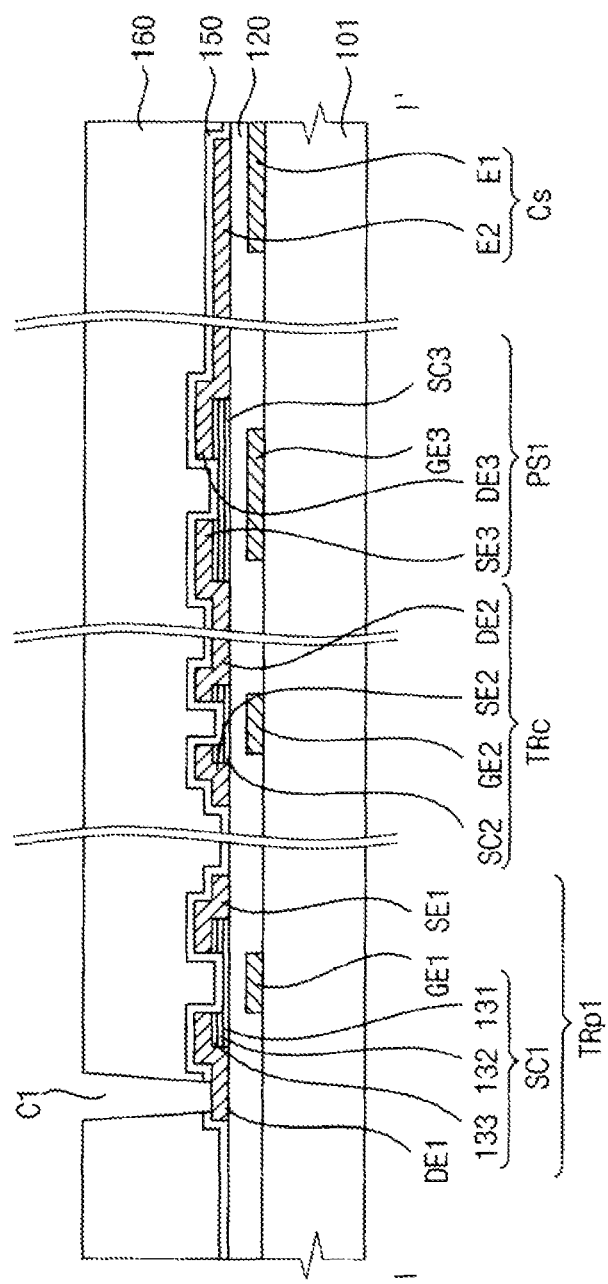

Referring FIGS. 1 and 4C, a protective layer 150 is disposed on the first base substrate 101 including the first, the second and the third semiconductor patterns SC1, SC2 and SC3 defining a channel. Examples of a material that may be used for the protective layer 150 may include a silicon oxide (SiOx) and/or a silicon nitride (SiNy). The protective layer 150 protects the amorphous silicon (a-Si) layer 131 and the amorphous silicon germanium (a-SiGe) layer 132 where exposed at the first, the second and the third semiconductor patterns SC1, SC2 and SC3. An organic insulating and planarizing layer 160 is thereafter deposited on the first base substrate 101 on which the protective layer 150 is formed. The organic insulating layer 160 may be formed to have thicker-thickness relatively, the first base substrate 101 on which a plurality of the layers is formed may be flatten by the organic insulating layer 160.

The organic insulating layer 160 is patterned so that an opening pattern is formed corresponding to the first, the second and the third contact holes C1, C2 and C3. Using the organic insulating layer 160 having the opening pattern as a mask, the first, the second and the third contact holes C1, C2 and C3 are further formed by etching through the protective layer 150 to thus expose contact areas below the gate insulating layer 120 and below the protective layer 150. For example, the first contact hole C1 exposes the first drain electrode DE1, the second contact hole C2 exposes the third source electrode SE3 and the line part LP of the storage line STLn+1, and the third contact hole C3 exposes a second electrode E2 of the sensing capacitor Cs.

Figure 4D:
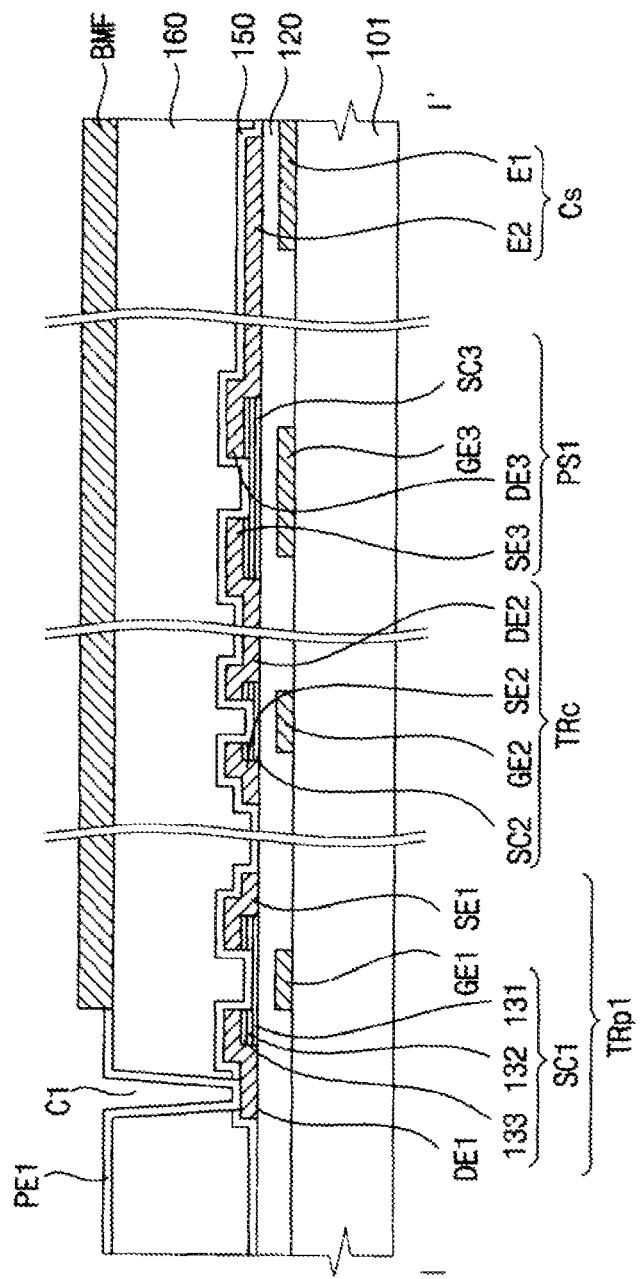

Referring to FIGS. 1, 4D and 5, a transparent conductive layer (PE) is thereafter disposed on the first base substrate 101 on which the first, the second and the third contact holes C1, C2 and C3 are formed. The transparent conductive layer is patterned to form a transparent conductive pattern by using an appropriate photoresist pattern. The patterned transparent conductive layer thus includes a first pixel electrode PE1, a second pixel electrode PE2, a third pixel electrode PE3, a first contact electrode CE1 and a second contact electrode CE2.

The first, the second and the third pixel electrodes PE1, PE2 and PE3 are connected to the first drain electrode DE1 through the contact holes C1 respectively. The first contact electrode CE1 connects the third source electrode SE3 to the line part LP of the storage line STLn+1 through the second contact holes C2. The second contact electrode CE2 connects the second electrodes E2 spaced apart from each other through the third contact holes C3.

A light blocking filter pattern layer is thereafter deposited on the first base substrate 101 on which the patterned transparent conductive layer is formed. The BMF filter layer may include a material composition having high transmittance with respect to an infrared light by adjusting an amount of included carbon black. In addition, the material composition may include a material having an optical density (OD) no more than four. For example, the material composition blocks a light having a wavelength spectral range from about 300 nm to about 800 nm, and has transmittance no less than 80% in a wavelength spectral range no less than 850 nm. Generally, a wavelength spectral range of a visible light is from about 400 nm to about 800 nm, and a wavelength spectral range of an infrared light is not less than about 760 nm. Accordingly, the light blocking filter layer has functions of blocking a visible light and of transmitting an infrared light.

The BMF layer is patterned so that a light blocking filter pattern BMF is formed on the first base substrate 101. The patterned light blocking filter pattern BMF is disposed on an area on which a metal pattern is formed and functions as a blocking pattern (for example, Black Matrix: BM), and is disposed on an area on which a channel of the infrared light sensing element IRS is formed and functions as a band pass filter. For example, the light blocking filter pattern BMF is disposed on an area on which the data lines DLm-2, DLm-1 and DLm, the gate lines GLn, the bias lines BLn, the reference lines RLk, the first, the second and the third pixel switching elements TRp1, TRp2 and TRp3, the control switching element TRc and the light sensors PS1, PS2 and PS3 are formed.

Therefore, according to the present embodiment, a light sensing element and a control switching element to detect an outer touch are formed by using a process of forming the pixel switching element TRp1 and the pixel electrode PE. Therefore, the light sensing element and the control switching element may be formed without an extra mask, so that a manufacturing process thereof may be simplified.

Hereinafter, the same reference numerals will be used to refer to the same or like parts as those described in the previous embodiment and any further repetitive explanation concerning the above elements will be omitted.

Figure 6:
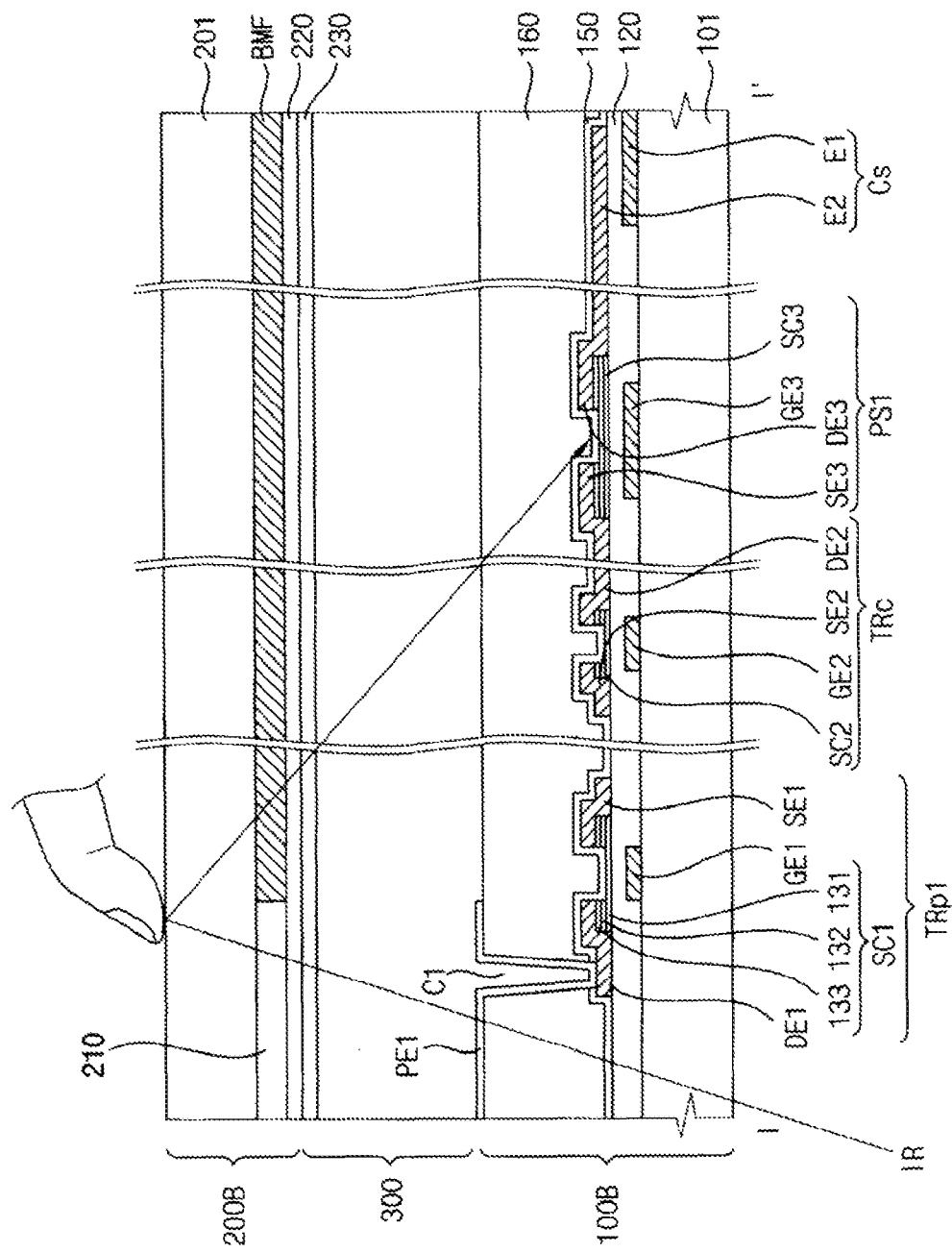
FIG. 6 is a cross-sectional view illustrating a touch-detecting display apparatus according to another embodiment.

FIG. 6 is a cross-sectional view illustrating a touch-detecting display apparatus according to another embodiment.

Referring to FIGS. 1 and 6, the touch-detecting display apparatus includes a first display substrate 100B, a second display substrate 200B and a liquid crystal material layer 300 interposed between the first display substrate 100B and the second display substrate 200B. According to the present embodiment, the touch-detecting display apparatus is substantially same as the touch-detecting display apparatus according to the previous embodiment (shown in FIG. 2) except that the light blocking filter pattern BMF is formed at least or additionally on the second display substrate 200B rather than only the lower substrate 100. Thus, any further repetitive explanation concerning others of the elements will be omitted.

The first display substrate 100B includes a first base substrate 101, a plurality of data lines DLm-2, DLm-1 and DLm, a plurality of reference lines RLk, a plurality of gate lines GLn, a plurality of bias lines BLn, a plurality of storage lines STLn and STLn+1, a first pixel switching element TRp1, a first pixel electrode PE1, a second pixel switching element TRp2, a second pixel electrode PE2, a third pixel switching element TRp3, a third pixel electrode PE3, a control switching element TRc, an infrared light sensing element IRS, a sensing capacitor Cs. Here, 'm', 'k', and 'n' are natural numbers.

The second display substrate 200B includes a second base substrate 201, a color filter layer 210, the light blocking filter pattern BMF, an overcoat layer 220 and a common electrode 230.

The color filter layer 210 includes a plurality of color filters. In one embodiment, the color filters include a red, a green and a blue filter. The color filters may include one or more multi-primary filters. At least one of the color filters should allow IR light rays to pass through.

The light blocking filter pattern BMF is disposed on an area on which a metal pattern is formed and functions as a blocking pattern (for example, Black-Matrix: BM) to block a visible light. Furthermore the light blocking filter pattern BMF is disposed on an area on which the third semiconductor pattern SC3 of the infrared light sensing element IRS is formed and at least in this area the light blocking filter pattern functions as a band pass filter to transmit a light having a predetermined wavelength, for example, an infrared light wavelength to which the IRS is sensitive.

For example, the light blocking filter pattern BMF is disposed on the second base substrate 201 corresponding to an area on which the data lines DLm-2, DLm-1 and DLm, the gate lines GLn, the bias lines BLn, the reference lines RLk, the first, the second and the third pixel switching elements TRp1, TRp2 and TRp3, the control switching element TRc and the light sensors PS1, PS2 and PS3 are formed.

The overcoat layer 220 is disposed on the second base substrate 201 on which the color filter layer 210 and the light blocking filter pattern BMF are formed, so that a surface of the second base substrate 201 is flatten (planarized). Alternatively, the overcoat layer 220 may be omitted.

The common electrode 230 is disposed on the second base substrate 201 on which the overcoat layer 220 is formed.

According to the present embodiment, a light sensing element and a control switching element to detect an outer touch are formed by using a process of forming the pixel switching element TRp1 and the pixel electrode PE. Therefore, the light sensing element and the control switching element may be formed without an extra mask, so that a manufacturing process may be simplified.

Figure 7:
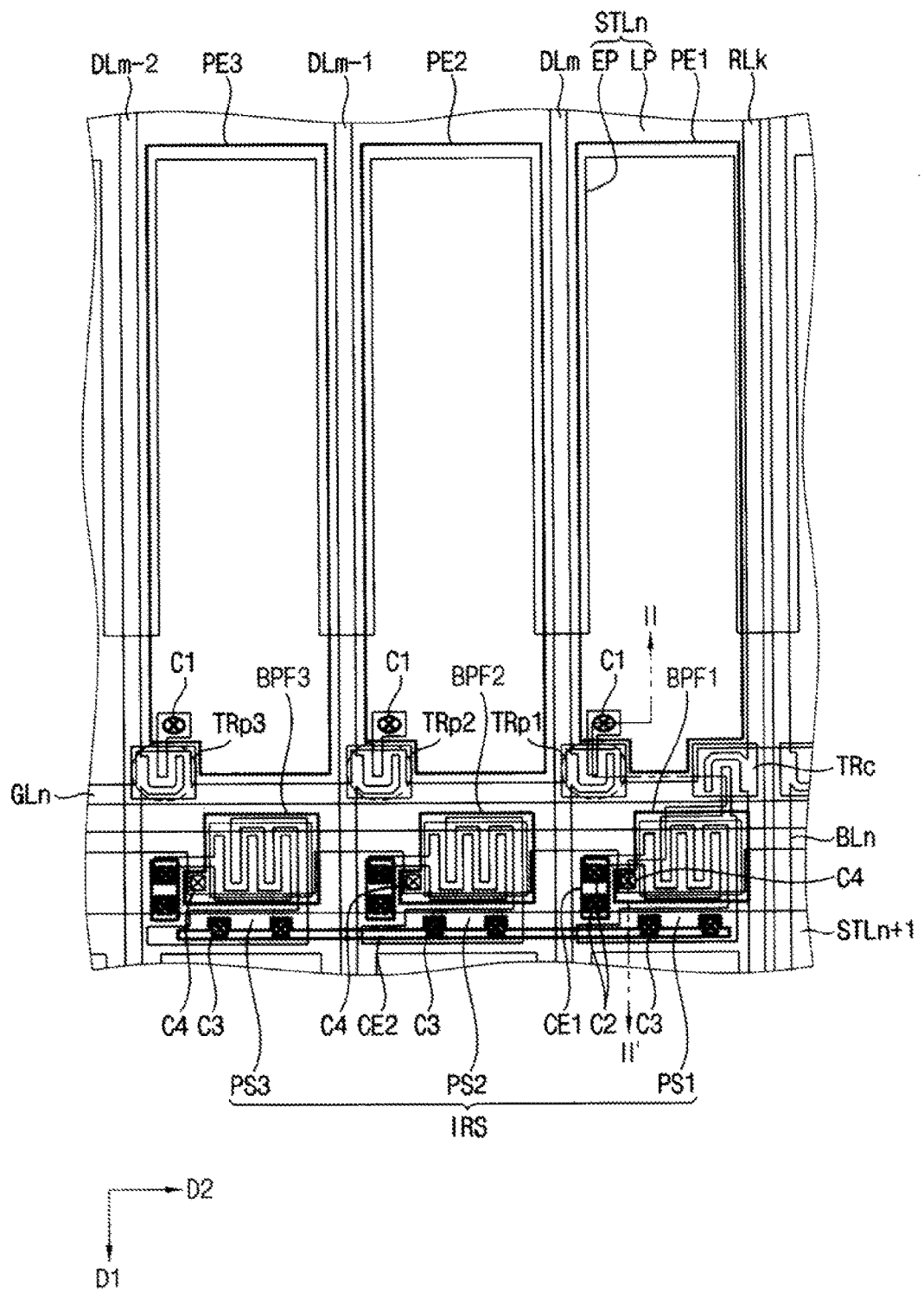
FIG. 7 is a plan view illustrating a touch-detecting display apparatus according to still another embodiment in accordance with the present disclosure.
Figure 8:
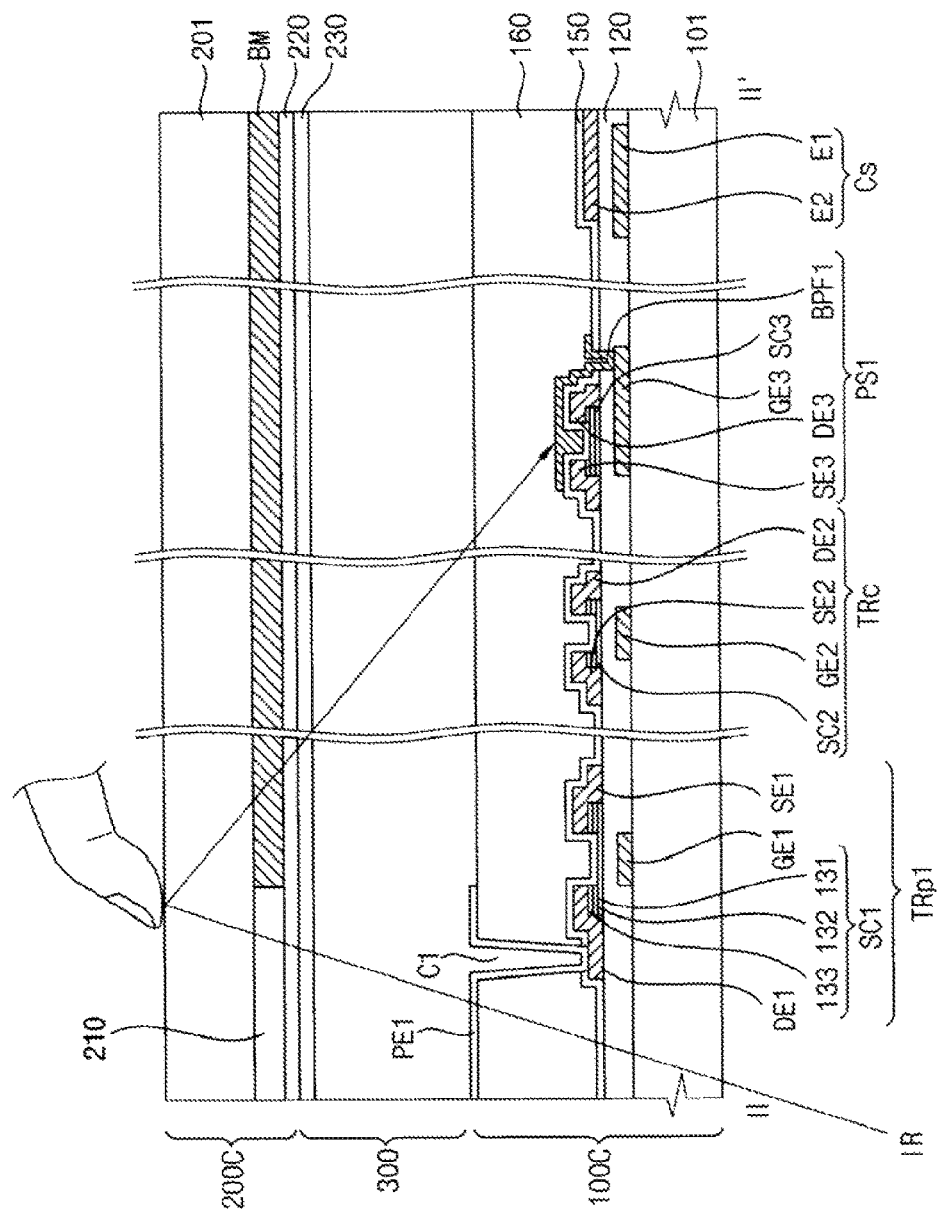
FIG. 8 is a cross-sectional view taken along a line II-IF of FIG. 7.

FIG. 7 is a plan view illustrating a touch-detecting display apparatus according to still another embodiment in accordance with the present disclosure. FIG. 8 is a cross-sectional view taken along a line II-IF of FIG. 7.

Referring to FIGS. 7 and 8, the touch-detecting display apparatus includes a first display substrate 100C, a second display substrate 200C and a liquid crystal layer 300 disposed between the first display substrate 100C and the second display substrate 200C.

The first display substrate 100C includes a first base substrate 101, a plurality of data lines DLm-2, DLm-1 and DLm, a plurality of reference lines RLk, a plurality of gate lines GLn, a plurality of bias lines BLn, a plurality of storage lines STLn and STLn+1, a first pixel switching element TRp1, a first pixel electrode PE1, a second pixel switching element TRp2, a second pixel electrode PE2, a third pixel switching element TRp3, a third pixel electrode PE3, a control switching element TRc, an infrared light sensing element IRS, a sensing capacitor Cs. Here, 'm', 'k', and 'n' are natural numbers. Elements of the first display substrate 100C are substantially same as the first display substrate 100 according to the embodiment (shown in FIG. 1) except for the structure of the infrared sensing element IRS and the placement of the light blocking filter patterns (BM plus BPF1). Hereinafter, any further repetitive explanation concerning the other elements will be omitted.

The infrared light sensing element IRS includes a first light sensor PS1, a second light sensor PS2 and a third light sensor PS3, which are connected to each other, and the first, the second and the third light sensor PS1, PS2 and PS3 are arranged in the second direction D2 on an area adjacent to the gate line GLn.

The first light sensor PS1 includes a third gate electrode GE3, a third semiconductor pattern SC3, a third source electrode SE3, a third drain electrode DE3 and a first band pass filter BPF1. The third gate electrode GE3 is connected to the n-th bias line BLn. The third semiconductor pattern SC3 is disposed over the third gate electrode GE3, and includes an amorphous silicon (a-Si) layer 131, an amorphous silicon germanium (a-SiGe) layer 132, and an ohmic contact layer 133. The third source electrode SE3 is connected to the second drain electrode DE2 of the control switching element TRc. The third drain electrode DE3 is connected by way of a first contact electrode CE1 to the storage line STLn+1 and through the second contact holes C2. A channel of the first light sensor PS1 is defined by the amorphous silicon germanium (a-SiGe) layer 132 of the third semiconductor pattern SC3 exposed through a gap between the third source electrode SE3 and the third drain electrode DE3.

The first band pass filter BPF1 (e.g., selectively light-passing for one or more corresponding and predetermined IR wavelengths) is disposed on the third source electrode SE3 and the third drain electrode DE3 to be overlapped with the third semiconductor pattern SC3. The first band pass filter BPF1 may for example transmit only a light having a predetermined wavelength, for example, a predetermined infrared light wavelength. The first band pass filter BPF1 is electrically connected to the third gate electrode GE3 of the first light sensor PS1 through a fourth contact hole C4. As a result of this electrical connection, the conductive band pass filter BPF1 may function as a second gate electrode for the field effect IRS.

The second light sensor PS2 includes a third gate electrode GE3, a third semiconductor pattern SC3, a third source electrode SE3, a third drain electrode DE3 and a second band pass filter BPF2. The third gate electrode GE3 is connected to the n-th bias line BLn. The third semiconductor pattern SC3 is disposed under the conductive band pass filter BPF1 and also over the third gate electrode GE3, and it includes an amorphous silicon (a-Si) layer 131, an amorphous silicon germanium (a-SiGe) layer 132, and an ohmic contact layer 133. The third source electrode SE3 is connected to a second contact electrode CE2 through the third source electrode SE3 of the first light sensor PS1 and third contact holes C3. The third drain electrode DE3 is connected to the first contact electrode CE1 through the storage line STLn+1 and second contact holes C2. A channel of the second light sensor PS2 is defined by the amorphous silicon germanium (a-SiGe) layer 132 of the third semiconductor pattern SC3 exposed through a gap between the third source electrode SE3 and the third drain electrode DE3.

The second band pass filter BPF2 (e.g., selectively light-passing for one or more corresponding and predetermined IR wavelengths) is disposed on the third source electrode SE3 and the third drain electrode DE3 to be overlapped with the third semiconductor pattern SC3. The second band pass filter BPF2 may for example transmit only a light having a predetermined wavelength, for example, in the infrared light band. The second band pass filter BPF2 is electrically conductive and electrically connected to the third gate electrode GE3 of the second light sensor PS2 through a fourth contact hole C4.

The third light sensor PS3 includes a third gate electrode GE3, a third semiconductor pattern SC3, a third source electrode SE3, a third drain electrode DE3 and a third band pass filter BPF3 (e.g., selectively light-passing for one or more corresponding and predetermined IR wavelengths). The third gate electrode GE3 is connected to the n-th bias line BLn. The third semiconductor pattern SC3 is disposed on the third gate electrode GE3, and includes an amorphous silicon (a-Si) layer 131, an amorphous silicon germanium (a-SiGe) layer 132, and an ohmic contact layer 133. The third source electrode SE3 is connected to the second contact electrode CE2 through the third source electrode SE3 of the first light sensor PS1 and third contact holes C3. The third drain electrode DE3 is connected to the first contact electrode CE1 through the storage line STLn+1 and second contact holes C2. A channel of the third light sensor PS3 is defined by the amorphous silicon germanium (a-SiGe) layer 132 of the third semiconductor pattern SC3 exposed through a gap between the third source electrode SE3 and the third drain electrode DE3.

The third band pass filter BPF3 is disposed insulatively over the third source electrode SE3 and the third drain electrode DE3 to be overlapped with the third semiconductor pattern SC3. The third band pass filter BPF3 may transmit only a light having a predetermined wavelength, for example, in the infrared light band. The third band pass filter BPF3 is electrically connected to the third gate electrode GE3 of the third light sensor PS3 through a fourth contact hole C4.

Therefore, according to the present embodiment (e.g., FIG. 8), each of the first, the second and the third light sensor PS1, PS2 and PS3 may have a dual gated field effect structure.

The second display substrate 200C includes a second base substrate 201, a color filter layer 210, a visible light blocking pattern BM, an overcoat layer 220 and a common electrode 230. The visible light blocking pattern BM lets through IR light rays.

The second base substrate 201 faces the first base substrate 101. The color filter layer 210 is disposed on the second base substrate 201. The color filter layer 210 may for example include a red color filter, a green color filter and a blue color filter, and in addition, one or more multi-primary filter like a yellow color filter, a cyan color filter, a magenta color filter, and so on. Each of the color filters may be disposed on the second base substrate 201 corresponding to the pixel electrode disposed on the first display substrate 100C. For example, a red filter may be disposed on the second base substrate 201 corresponding to an area on which the third pixel electrode PE3 is formed, a green filter may be disposed on the second base substrate 201 corresponding to an area on which the second pixel electrode PE2 is formed, and a blue filter may be disposed on the second base substrate 201 corresponding to an area on which the first pixel electrode PE1 is formed. At least one of the color filters should be light-passing with respect to IR light rays.

The light blocking pattern BM blocks a visible light. The light blocking pattern BM is disposed on the second base substrate 201 corresponding to an area on which a metal pattern of the first display substrate 100C is formed. For example, the light blocking pattern BM is disposed on an area on which the data lines DLm-2, DLm-1 and DLm, the gate lines GLn, the first, the second and the third pixel switching elements TRp1, TRp2 and TRp3 and the light sensors PS1, PS2 and PS3 are formed.

The infrared light IR generated under the touch-detecting display apparatus is transmitted to an object (e.g., the finger shown in FIG. 8) touching on the surface of the touch-detecting display apparatus, and the infrared light reflected by the object is incident into the third semiconductor pattern SC3 of the infrared sensing element IRS in the touch-detecting display apparatus again. Accordingly, a touch position may be detected by a photo current flowing through the infrared sensing element IRS.

The overcoat layer 220 is disposed on the second base substrate 201 on which the color filter layer 210 and the light blocking pattern BM are formed, so that a surface of the second base substrate 201 is flatten (planarized). Alternatively, the overcoat layer 220 may be omitted.

The common electrode 230 is disposed on the second base substrate 201 on which the overcoat layer 220 is formed.

FIG. 9A to FIG. 9D are cross-sectional views for explaining a method of manufacturing the first display substrate of FIG. 8. FIG. 10A to FIG. 10C are corresponding plan views for explaining a method of manufacturing the first display substrate of FIG. 8.

Figure 9A:
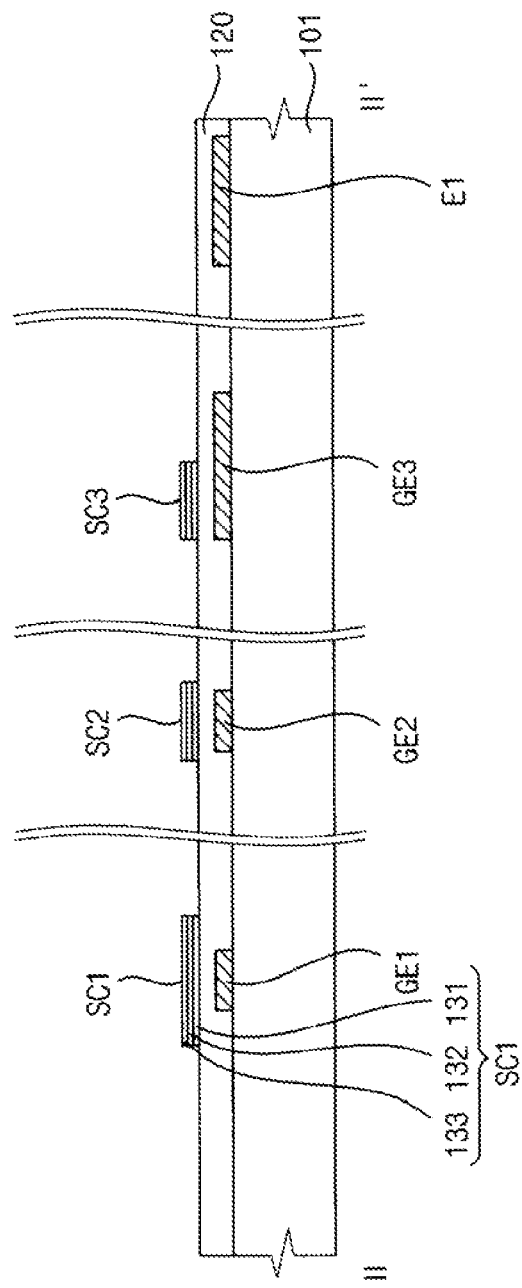
Figure 10A:
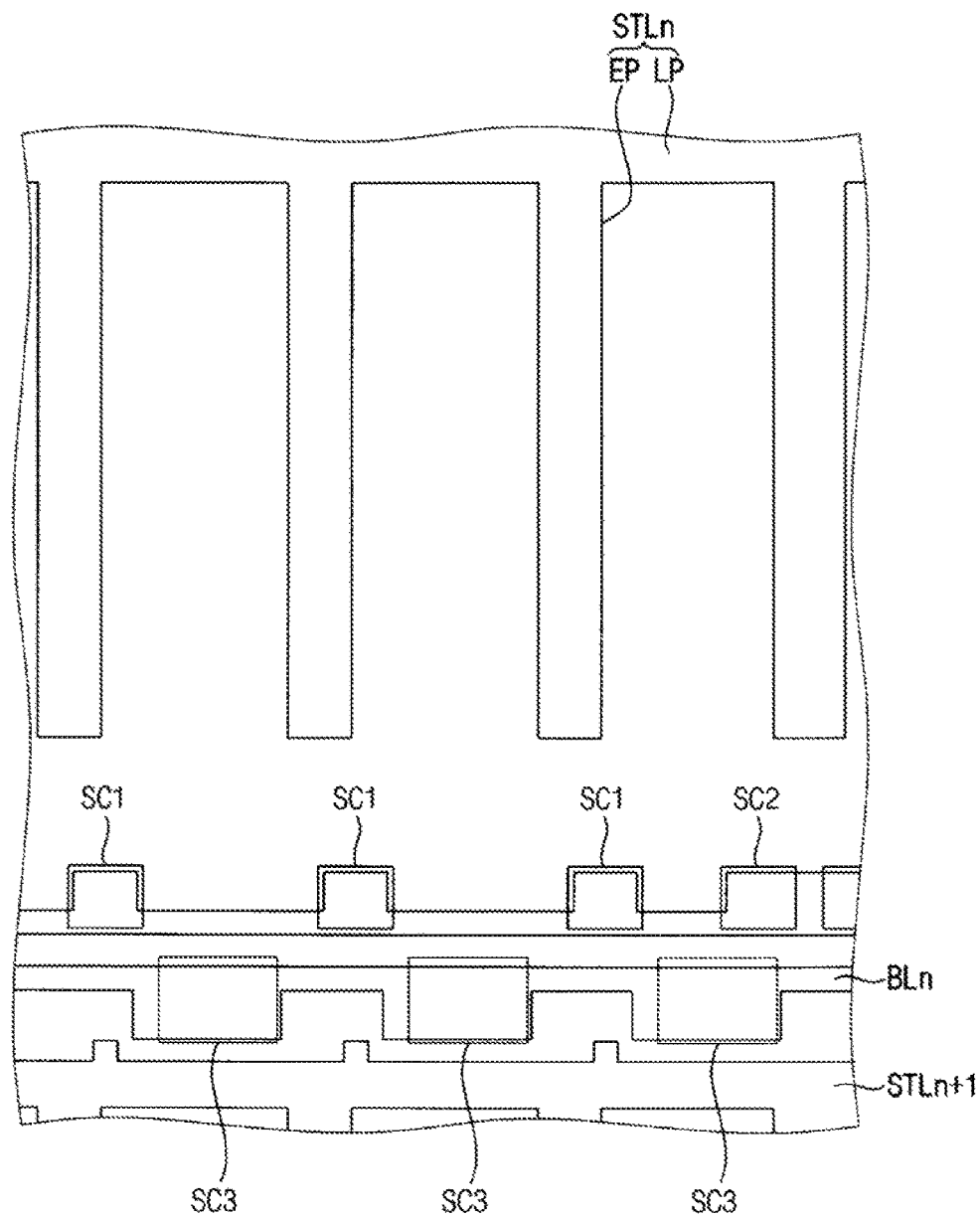
FIGS. 10A, 10B, and 10C are plan views for explaining a method of manufacturing the first display substrate of FIG. 8.
Figure 10B:
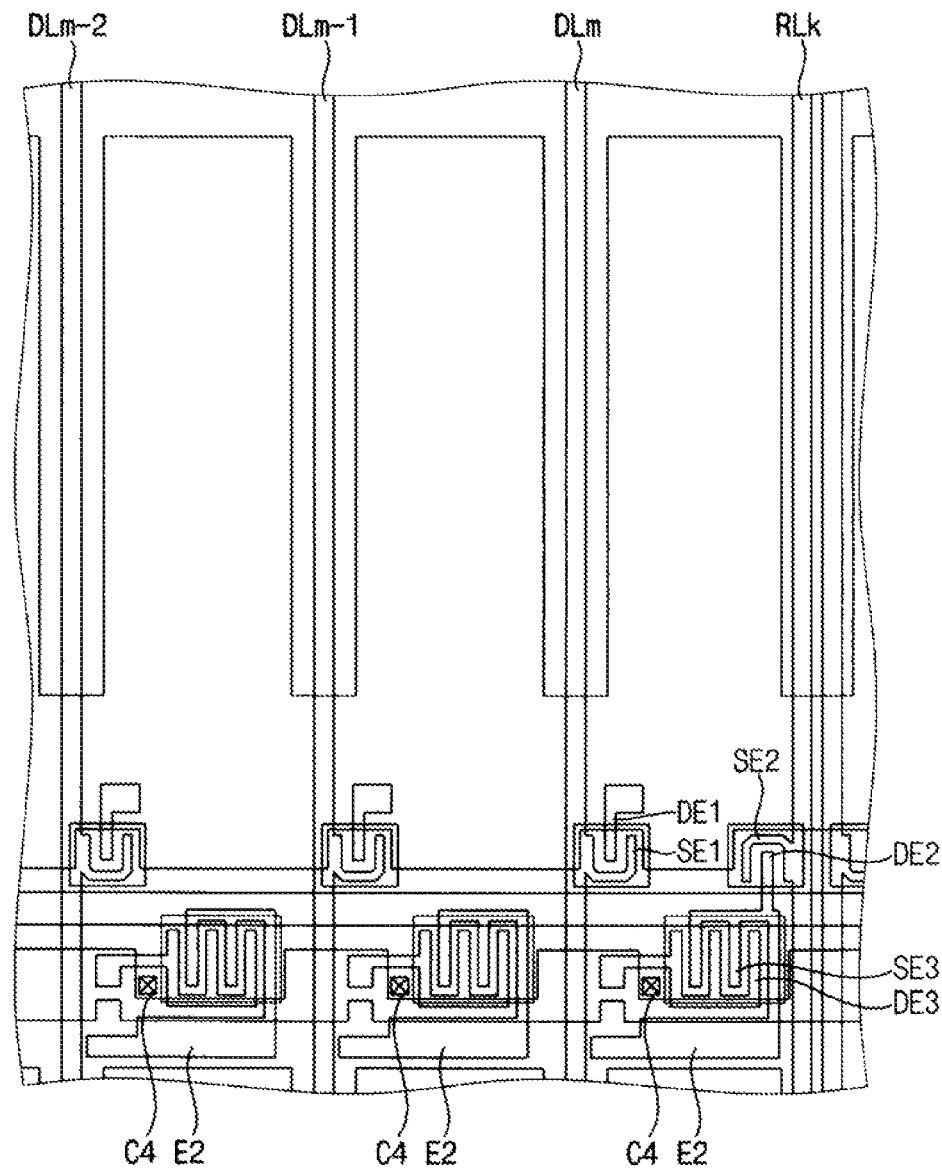
Figure 10C:
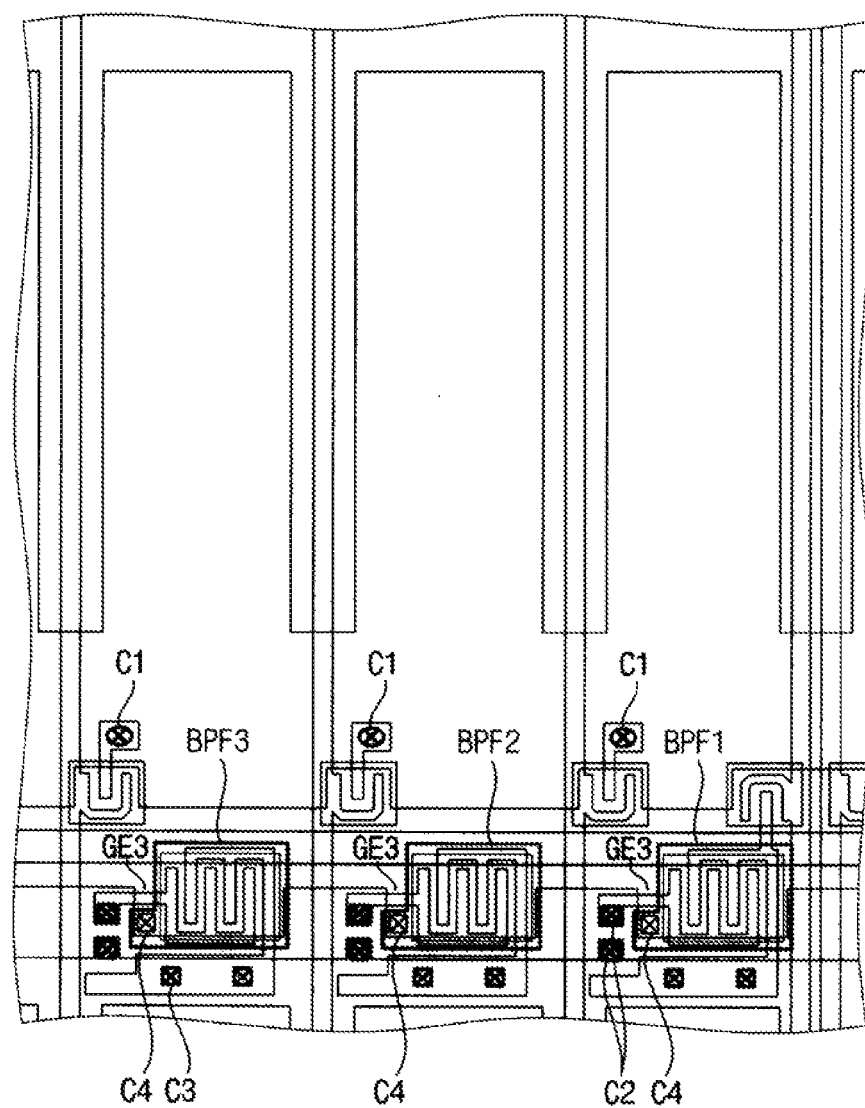

Referring to FIGS. 9A and 10A, a gate metal layer is formed on the first base substrate 101. The gate metal layer is patterned to form a gate metal pattern by using a photoresist pattern. The gate metal pattern includes gate lines GLn, storage lines STLn and STLn+1, bias lines BLn, a first gate electrode GE1, a second gate electrode GE2 and a third gate electrode GE3.

A gate insulating layer 120 is blanket deposited on the first base substrate 101 on which the gate metal pattern is formed. Examples of a material that may be used for the gate insulating layer 120 may include a silicon oxide (SiOx) and/or a silicon nitride (SiNy).

A semiconductor layer 130 is blanket formed on the first base substrate 101 on which the gate insulating layer 120 is formed. The semiconductor layer 130 includes an amorphous silicon (a-Si) layer 131, an amorphous silicon germanium (a-SiGe) layer 132, and an ohmic contact layer 133. The ohmic contact layer 133 may include amorphous silicon doped with n+ ion.

The semiconductor layer 130 is then patterned by for example using a corresponding photoresist pattern so that a first semiconductor pattern SC1, a second semiconductor pattern SC2 and a third semiconductor pattern SC3 is formed for example as respective islands. The first semiconductor pattern SC1 is thereby disposed over the first gate electrode GE1, the second semiconductor pattern SC2 is disposed over the second gate electrode GE2, and the third semiconductor pattern SC3 is disposed over the third gate electrode GE3.

Referring to FIGS. 9B and 10B, a source metal layer is next blanket deposited on the first base substrate 101 on which the first, the second and the third semiconductor patterns SC1, SC2 and SC3 are formed. The source metal layer is patterned to form a source metal pattern by for example using a corresponding photoresist pattern. After patterning, the corresponding source metal pattern includes data lines DLm, DLm-1 and DLm-2, reference lines RLk, a first source electrode SE1, a first drain electrode DE1, a second source electrode SE2, a second drain electrode DE2, a third source electrode SE3, a third drain electrode DE3 and a second electrode E2 of the sensing capacitor Cs.

The first, the second and the third semiconductor patterns SC1, SC2 and SC3 are selectively etched by using as etch masks the first, the second and the third source electrodes SE1, SE2 and SE3 and the first, the second and the third drain electrodes DE1, DE2 and DE3. First of all, each the ohmic contact layer 133 that is an upper layer of the first, the second and the third semiconductor patterns SC1, SC2 and SC3 is selectively etched. And then, each the amorphous silicon germanium (a-SiGe) layer 132 of the first and the second semiconductor patterns SC1 and SC2 is selectively etched under a different etching condition.

Therefore, the amorphous silicon (a-Si) layer 131 is exposed at the first and the second semiconductor patterns SC1 and SC2 and the amorphous silicon germanium (a-SiGe) layer 132 is exposed at the third semiconductor pattern SC3. Accordingly, a pixel switching element TRp1 and a control switching element TRc that should have excellent switching characteristics may use the amorphous silicon (a-Si) layer 131 as a back channel, and the infrared light sensing element IRS that should have excellent light sensitivity characteristics may use the amorphous silicon germanium (a-SiGe) layer 132 as a back channel.

A protective layer 150 is disposed on the first base substrate 101 including the first, the second and the third semiconductor patterns SC1, SC2 and SC3 defining a channel. Examples of a material that may be used for the protective layer 150 may include a silicon oxide (SiOx) and/or a silicon nitride (SiNy).

The protective layer 150, and the gate insulating layer 120 being below the protective layer 150 are etched so that a fourth contact hole C4 is formed. The fourth contact hole C4 exposes the third gate electrode GE3.

Figure 9C:
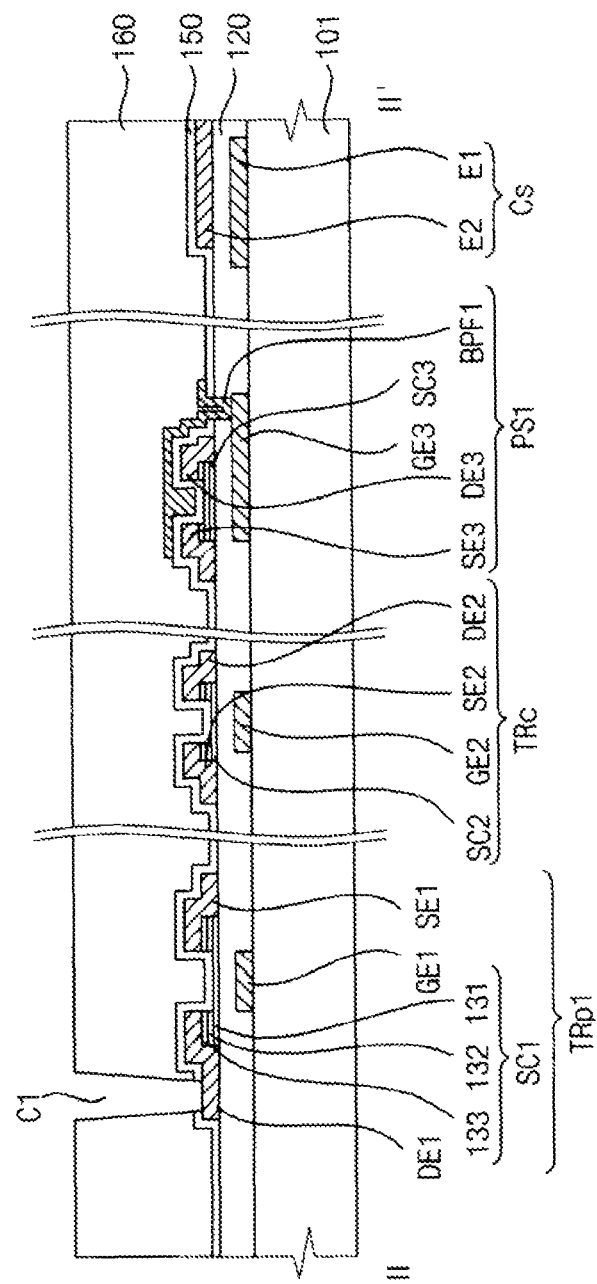

Referring to FIGS. 9C and 10C, a band pass filter layer is disposed on the protective layer 150 on which the fourth contact hole C4 is formed. The band pass filter layer includes a material selectively transmitting light rays having corresponding one or more predetermined wavelength, for example, in the infrared light band. The band pass filter layer is patterned to form the first, the second and the third band pass filters BPF1, BPF2 and BPF3 by for example using a corresponding photoresist pattern.

The first band pass filter BPF1 is disposed over the third semiconductor pattern SC3 of the first light sensor PS1 and is connected to the third gate electrode GE3 of the first light sensor PS1 through the fourth contact hole C4. The second band pass filter BPF2 is disposed over the third semiconductor pattern SC3 of the second light sensor PS2 and is connected to the third gate electrode GE3 of the second light sensor PS2 through the fourth contact hole C4. The third band pass filter BPF3 is disposed over the third semiconductor pattern SC3 of the third light sensor PS3 and is connected to the third gate electrode GE3 of the third light sensor PS3 through the fourth contact hole C4. Therefore, each of the first, the second and the third light sensors PS1, PS2 and PS3 has a dual gated field effect structure.

Figure 9D:
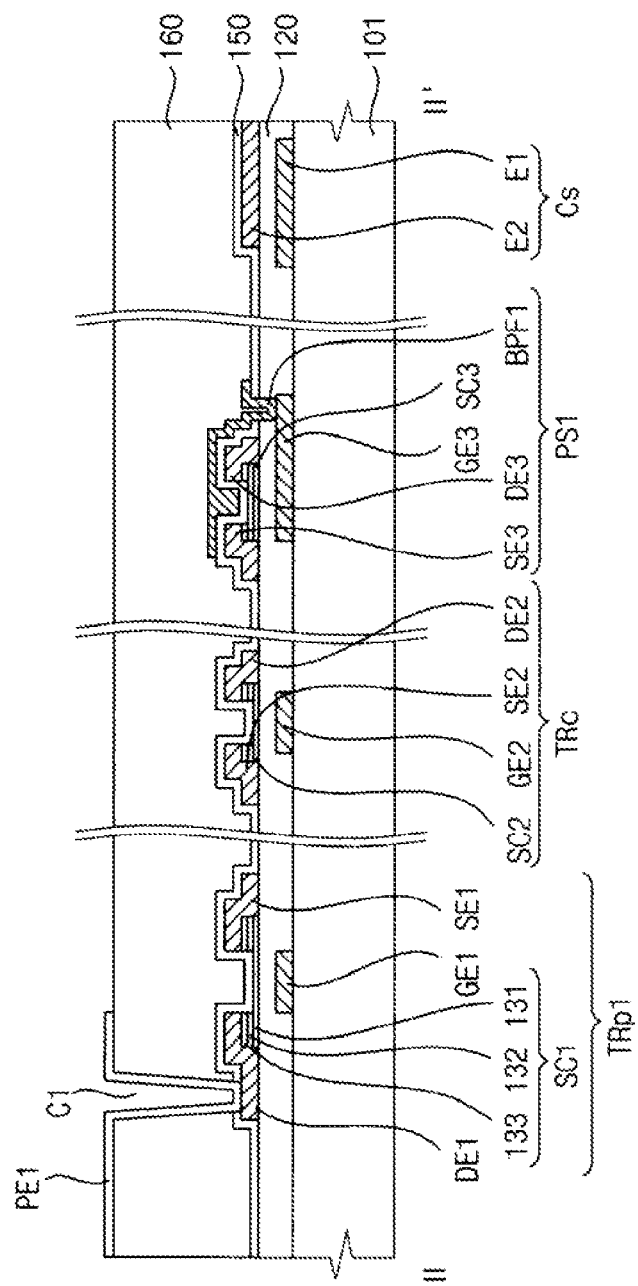

Referring to FIGS. 8 and 9D, an organic insulating layer 160 is disposed on the first base substrate 101 on which the first, the second and the third band pass filters BPF1, BPF2 and BPF3 are formed. The organic insulating layer 160 is etched to form opening patterns corresponding to the first, the second and the third contact holes. The organic insulating layer 160 is also planarized.

Using the organic insulating layer 160 having the opening pattern as a mask, and the first, the second and the third contact holes C1, C2 and C3 are formed by etching the protective layer 150 exposed through the opening patterns and the gate insulating layer 120 placed beneath the protective layer 150. The first contact hole C1 exposes the first drain electrode DE1, the second contact hole C2 exposes the third source electrode SE3 and the line part LP of the storage line STLn+1, and the third contact hole C3 exposes a second electrode E2 of the sensing capacitor Cs.

A transparent conductive layer (e.g., composed of an ITO or an IZO) is disposed on the first base substrate 101 on which the first, the second and the third contact holes C1, C2 and C3 are formed. The transparent conductive layer is patterned to form a transparent conductive pattern by for example using a corresponding photoresist pattern. The transparent conductive pattern includes a first pixel electrode PE1, a second pixel electrode PE2, a third pixel electrode PE3, a first contact electrode CE1 and a second contact electrode CE2. The first, the second and the third pixel electrodes PE1, PE2 and PE3 are connected to the first drain electrode DE1 through the contact holes C1, respectively. The first contact electrode CE1 connects the third source electrode SE3 to the line part LP of the storage line STLn+1 through the second contact holes C2. The second contact electrode CE2 connects the second electrodes E2 spaced apart from each other through the third contact holes C3.

According to the present embodiment, the band pass filter and the fourth contact hole C4 connecting the band pass filter to the third gate electrode may be formed with the same process used for the pixel switching element TRp1 and the pixel electrode PE so that a light sensing element and a control switching element to detect an outer touch are formed. Therefore, a manufacturing process may be simplified with compared to a conventional process to provide a touch position detecting panel.

Figure 11:
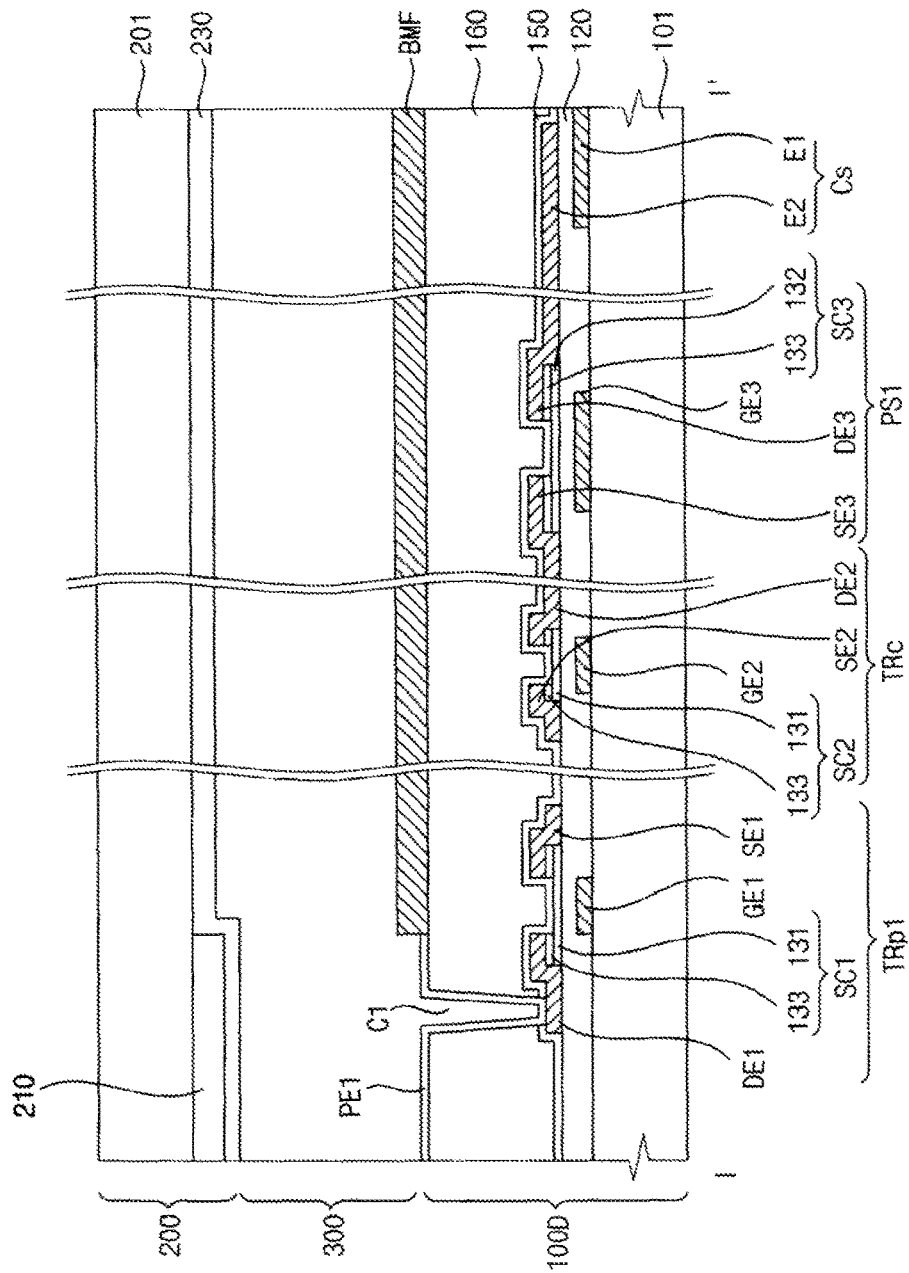
FIG. 11 is a cross-sectional view illustrating a touch-detecting display apparatus according to still another embodiment of the present disclosure.

FIG. 11 is a cross-sectional view illustrating a touch-detecting display apparatus according to still another embodiment of the present disclosure.

Referring to FIGS. 1 and 11, the touch-detecting display apparatus includes a first display substrate 100D, a second display substrate 200, a liquid crystal layer 300 disposed between the first display substrate 100 and the second display substrate 200.

The first display substrate 100D includes a first base substrate 101 a plurality of data lines DLm-2, DLm-1 and DLm, a plurality of reference lines RLk, a plurality of gate lines GLn, a plurality of bias lines BLn, a plurality of storage lines STLn and STLn+1, a first pixel switching element TRp1, a first pixel electrode PE1, a second pixel switching element TRp2, a second pixel electrode PE2, a third pixel switching element TRp3, a third pixel electrode PE3, a control switching element TRc, an infrared light sensing element IRS, a sensing capacitor Cs and a light blocking filter pattern (BMF: Black-Matrix/Band-Pass-Filter). Here, 'm', 'k', and 'n' are natural numbers.

According to the present embodiment, the first display substrate 100D is substantially same as the first display substrate as shown in FIG. 2 except for the structures of the first, the second and the third pixel switching element TRp1, TRp2 and TRp3, the control switching element TRc and the infrared light sensing element IRS. Thus, any further repetitive explanation concerning other elements will be omitted.

Each of the first, the second and the third pixel switching elements TRp1, TRp2 and TRp3 includes a first gate electrode GE1, a first semiconductor pattern SC1, a first source electrode SE1 and a first drain electrode DE1. The first semiconductor pattern SC1 includes an amorphous silicon (a-Si) layer 131 and an ohmic contact layer 133 (but not the amorphous silicon germanium (a-SiGe) layer 132 which serves as a back channel in the above embodiment of FIG. 2). The amorphous silicon (a-Si) layer 131 of the first semiconductor pattern SC1 is exposed through a gap between the first source electrode SE1 and the first drain electrode DE1, which corresponds to a channel area.

The control switching element TRc includes a second gate electrode GE2, a second semiconductor pattern SC2, a second source electrode SE2 and a second drain electrode DE2. The second semiconductor pattern SC2 includes an amorphous silicon (a-Si) layer 131, and an ohmic contact layer 133. The amorphous silicon (a-Si) layer 131 of the second semiconductor pattern SC2 is exposed through a gap between the second source electrode SE2 and the second drain electrode DE2, which corresponds to a channel area.

The infrared light sensing element IRS includes a first light sensor PS1, a second light sensor PS2 and a third light sensor PS3, which are connected to each other, and the first, the second and the third light sensor PS1, PS2 and PS3 are arranged in the second direction D2 on an area adjacent to the n-th gate line GLn.

Each of the first, the second and the third light sensor PS1, PS2 and PS3 includes a third gate electrode GE3, a third semiconductor pattern SC3, a third source electrode SE3 and a third drain electrode DE3. The third semiconductor pattern SC3 includes an amorphous silicon germanium (a-SiGe) layer 132, an ohmic contact layer 133. The amorphous silicon germanium (a-SiGe) layer 132 of the third semiconductor pattern SC3 through a gap between the third source electrode SE3 and the third drain electrode DE3, which corresponds to a channel area.

Therefore, the amorphous silicon (a-Si) layer 131 is exposed in the first and the second semiconductor patterns SC1 and SC2 and the amorphous silicon germanium (a-SiGe) layer 132 is exposed in the third semiconductor pattern SC3. Accordingly, a pixel switching element TRp1 and a control switching element TRc that should have excellent switching characteristics may use the amorphous silicon (a-Si) layer 131 as a back channel, and the infrared light sensing element IRS that should have excellent light sensitivity characteristics may use the amorphous silicon germanium (a-SiGe) layer 132 as a back channel.

FIG. 12A to FIG. 12D are cross-sectional views for explaining a method of manufacturing the first display substrate of FIG. 11.

Figure 12A:
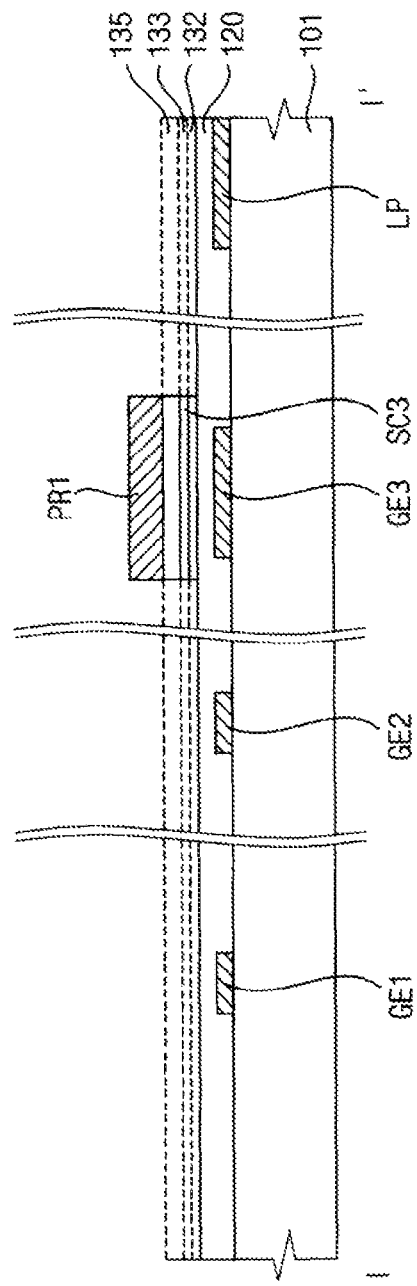
FIGS. 12A, 12B, 12C, and 12D are cross-sectional views for explaining a method of manufacturing a first display substrate of FIG. 11.

Referring to FIGS. 1, 11 and 12A, a gate metal layer is formed on the first base substrate 101. The gate metal layer is patterned to form a gate metal pattern by using a corresponding photoresist pattern. The gate metal pattern includes gate lines GLn, storage lines STLn and STLn+1, bias lines BLn, a first gate electrode GE1, a second gate electrode GE2 and a third gate electrode GE3.

A gate insulating layer 120, an amorphous silicon (a-Si) layer 131 and an ohmic contact layer 133 are deposited sequentially on the first base substrate 101 on which the gate metal pattern is formed. Examples of a material that may be used for the gate insulating layer 120 may include a silicon oxide (SiOx) and a silicon nitride (SiNy). The ohmic contact layer 133 may include amorphous silicon doped with n+ dopants (e.g., ion implanted).

An active protective layer APL is formed on the first base substrate 101 on which the ohmic contact layer 133 is formed. The active protective layer APL may include a metal material and it will be used to form element 135 in FIG. 12B.

Using a first photoresist pattern in a wet etching type, the APL layer is patterned to thereby define an active protective pattern 135 over the ohmic contact layer 133 corresponding to an area on which the third gate electrode GE3 is formed. And then, in a dry etching type, the ohmic contact layer 133 and the amorphous silicon germanium (a-SiGe) layer 132 are etched to form a correspondingly patterned, third semiconductor pattern SC3 beneath the active protective pattern 135.

Figure 12B:
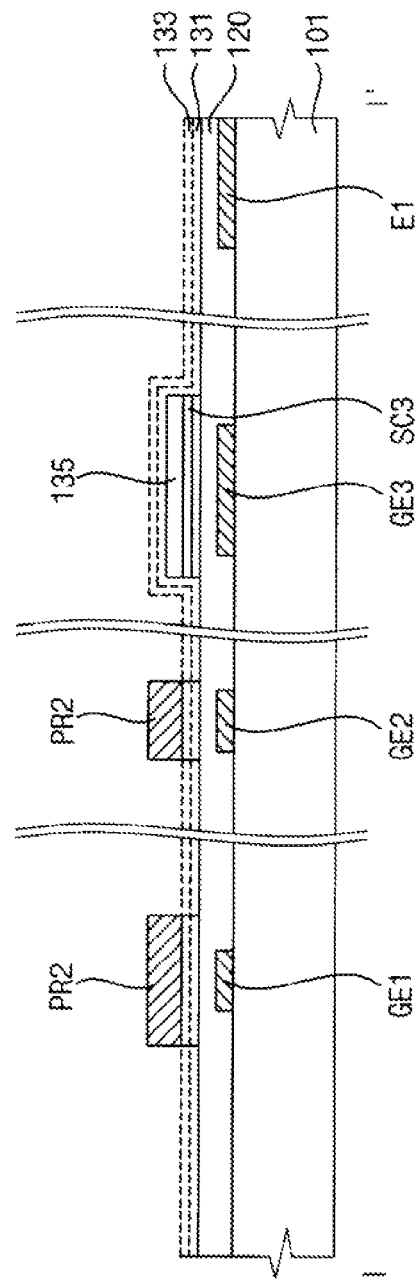

Referring to FIGS. 1, 11 and 12B, the amorphous silicon (a-Si) layer 131 and the ohmic contact layer 133 are disposed on the first base substrate 101 which the third semiconductor pattern SC3 and the active protective pattern 135 are formed on the third gate electrode GE3.

Using a second photoresist pattern PR2 as an etch mask, the amorphous silicon (a-Si) layer 131 and the ohmic contact layer 133 are patterned. And then, the first semiconductor pattern SC1 is formed on the first gate electrode GE1 and the second semiconductor pattern SC2 is formed on the second gate electrode GE2. The active protective pattern 135 formed over the third semiconductor pattern SC3 protects the third semiconductor pattern SC3 from an etching process in the course of patterning the amorphous silicon (a-Si) layer 131 and the ohmic contact layer 133.

Thereafter, the sacrificial active protective pattern 135 is removed.

Figure 12C:
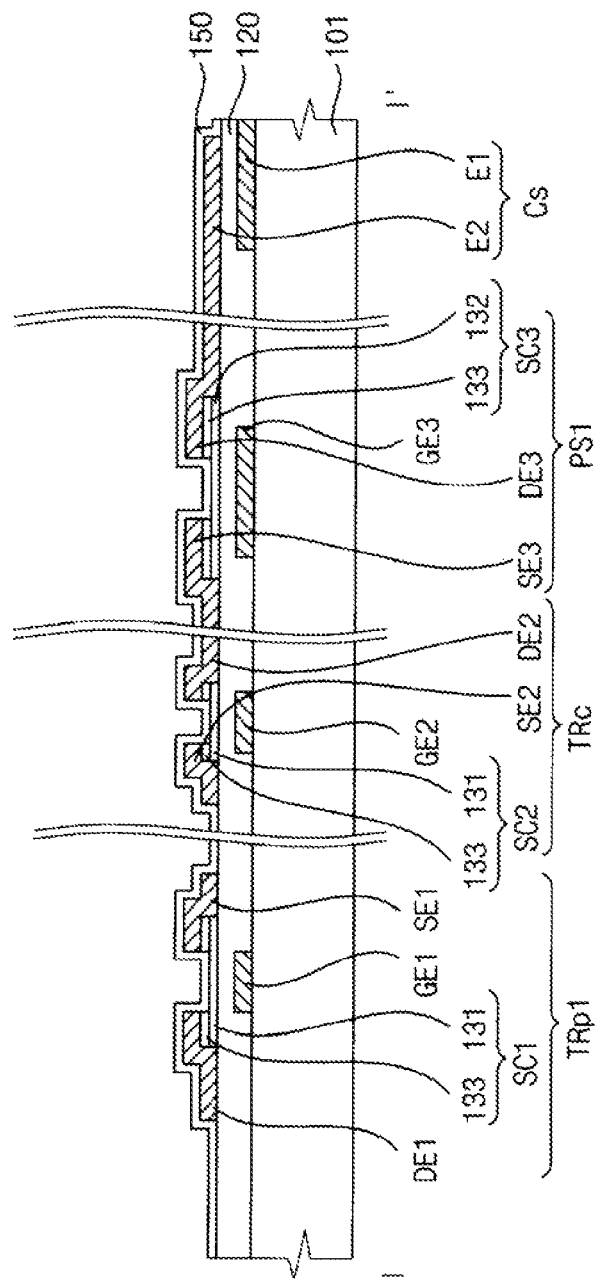

Referring to FIGS. 1, 11 and 12C, a source metal layer is disposed on the first base substrate 101 on which the first, the second and the third semiconductor patterns SC1, SC2 and SC3 are formed. The source metal layer is patterned to form a source metal pattern by using the photoresist pattern. The source metal pattern includes data lines DLm, DLm-1 and DLm-2, reference lines RLk, a first source electrode SE1, a first drain electrode DE1, a second source electrode SE2, a second drain electrode DE2, a third source electrode SE3, a third drain electrode DE3 and a second electrode E2 of the sensing capacitor Cs.

Thereafter, using the first, the second and the third source electrodes SE1, SE2 and SE3 and the first, the second and the third drain electrodes DE1, DE2 and DE3 as a mask, the ohmic contact layers 133 of the first, the second and the third semiconductor patterns SC1, SC2 and SC3 are removed. Therefore, the amorphous silicon (a-Si) layer 131 is exposed at the first and the second semiconductor patterns SC1 and SC2 and the amorphous silicon germanium (a-SiGe) layer 132 is exposed at the third semiconductor pattern SC3. Accordingly, a pixel switching element TRp1 and a control switching element TRc that should have excellent switching characteristics may use the amorphous silicon (a-Si) layer 131 as a back channel, and the infrared light sensing element IRS that should have excellent light sensitivity characteristics may use the amorphous silicon germanium (a-SiGe) layer 132 as a back channel.

A protective layer 150 is disposed on the first base substrate 101 on which the first, the second and the third semiconductor patterns SC1, SC2 and SC3 having the exposed amorphous silicon (a-Si) layer 131 or the exposed amorphous silicon germanium (a-SiGe) layer 132, are formed. Examples of a material that may be used for the protective layer 150 may include a silicon oxide (SiOx) and a silicon nitride (SiNy). The protective layer 150 protects the amorphous silicon (a-Si) layer 131 and the amorphous silicon germanium (a-SiGe) layer 132 exposed at the first, the second and the third semiconductor patterns SC1, SC2 and SC3.

Figure 12D:
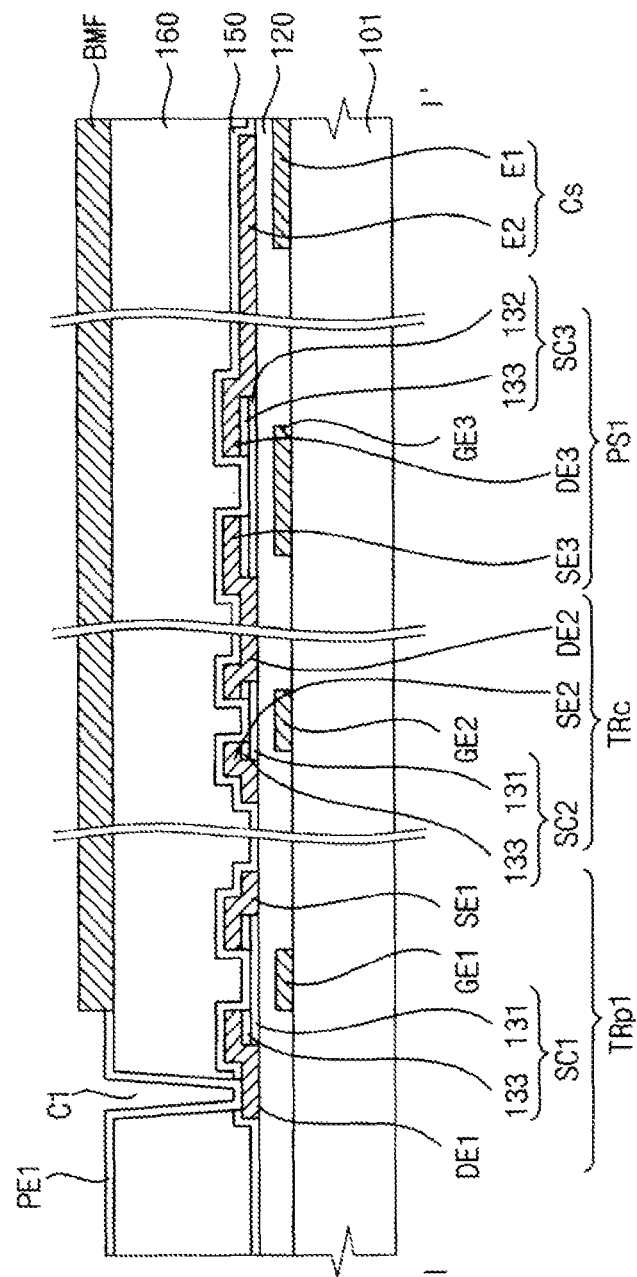

Referring to FIGS. 1, 11 and 12D, an organic insulating layer 160 is disposed on the first base substrate 101 on which the protective layer 150 is formed. The organic insulating layer 160 may be thicker relatively and planarized at its top surface, and the first base substrate 101 on which a plurality of the layers is formed may be thus flattened by the organic insulating layer 160.

The organic insulating layer 160 is patterned so that an opening patterns corresponding to the first, the second and the third contact holes C1, C2 and C3 are formed. Using the organic insulating layer 160 having the opening pattern as a mask, the first, the second and the third contact holes C1, C2 and C3 are formed by etching the protective layer 150 exposed through the opening pattern and the gate insulating layer 120 being below the protective layer 150.

A transparent conductive layer is disposed on the first base substrate 101 on which the first, the second and the third contact holes C1, C2 and C3 are formed. The transparent conductive layer is patterned to form a transparent conductive pattern by using the photoresist pattern. The transparent conductive pattern includes a first pixel electrode PE1, a second pixel electrode PE2, a third pixel electrode PE3, a first contact electrode CE1 and a second contact electrode CE2.

A light blocking filter layer (BMF) is disposed on the first base substrate 101 on which the transparent conductive pattern is formed. The light blocking filter layer includes a material blocking a visible light and transmitting an infrared light. The light blocking filter layer may consist of a material composition having high transmittance with respect to an infrared light by adjusting the amount of a carbon black provided therein. In addition, the material composition may include a material having an optical density (OD) which is four or smaller than four.

The light blocking filter layer is patterned so that a light blocking filter pattern BMF is disposed on the first base substrate 101. The light blocking filter pattern BMF is disposed on an area on which a metal pattern is formed and functions as a blocking pattern (for example, Black Matrix: BM), and is disposed on an area on which the third semiconductor pattern SC3 of the infrared light sensing element IRS is formed and functions as a band pass filter to transmit a light having a predetermined wavelength, for example, an infrared light.

Although not shown, the light blocking filter pattern BMF may be disposed on the second display substrate like the touch-detecting display apparatus (shown in FIG. 6) according to another embodiment. Therefore, a touch-detecting display apparatus may include the first display substrate 100D according to the present embodiment and the second display substrate 200B according to another embodiment.

According to the present embodiment, the third semiconductor pattern SC3 may formed with the pixel switching element TRp1 and the pixel electrode PE so that a light sensing element and a control switching element to detect an outer touch are formed. Therefore, a manufacturing process may be simplified with compared to a conventional process to provide a touch position panel.

FIG. 13A to FIG. 13D are cross-sectional views for explaining a method of manufacturing the first display substrate according to still another embodiment of the present disclosure.

Figure 13A:
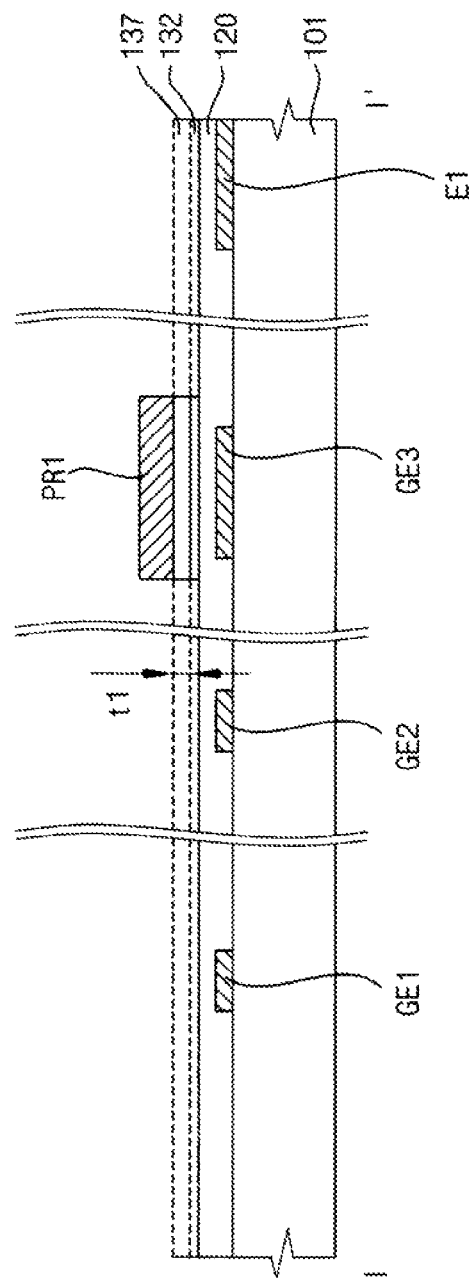

Referring to FIGS. 1 and 13A, a gate metal layer is formed on the first base substrate 101. The gate metal layer is patterned to form a gate metal pattern by using a corresponding photoresist pattern. The gate metal pattern includes gate lines GLn, storage lines STLn and STLn+1, bias lines BLn, a first gate electrode GE1, a second gate electrode GE2 and a third gate electrode GE3.

A gate insulating layer 120, an amorphous silicon germanium (a-SiGe) layer 132 and an ohmic sacrificial layer 137 are deposited sequentially on the first base substrate 101 on which the gate metal pattern is formed. The ohmic sacrificial layer 137 acts as an ohmic contact layer, and is partially removed during a following process etching an amorphous silicon layer (where PR1 covers the selectively not removed portion). Accordingly, the ohmic sacrificial layer 137 may include amorphous silicon or impurities doped n+ dopants. The ohmic sacrificial layer 137 has a first thickness t1 which is greater than a second thickness t2 of a general ohmic contact layer. Therefore, after removed partially during the process of etching the amorphous silicon layer, the ohmic may function as a role of the ohmic contact layer. The source metal layer is patterned to form a source metal pattern by using the photoresist pattern.

The amorphous silicon germanium (a-SiGe) layer 132 and the ohmic sacrificial layer 137 are patterned to form a preliminary semiconductor pattern PSC on the third gate electrode GE3 by using a first photoresist pattern PR1.

Referring to FIGS. 1 and 13B, an amorphous silicon (a-Si) layer 131 and an ohmic contact layer 133 are deposited sequentially on the first base substrate 101 on which the preliminary semiconductor pattern PSC is formed. Using a second photoresist pattern PR2 as an etch mask, the amorphous silicon (a-Si) layer 131 and the ohmic contact layer 133 is etched to form a first semiconductor pattern SC1 on the first gate electrode GE1, and to form a second semiconductor pattern SC2 on the second gate electrode GE2.

Referring to FIGS. 1 and 13C, during the process of etching the amorphous silicon (a-Si) layer 131 and the ohmic contact layer 133, the ohmic sacrificial layer 137 placed on the preliminary semiconductor pattern PSC is partially etched to form a third semiconductor pattern SC3. Accordingly, the third semiconductor pattern SC3 has the ohmic contact layer 133 and the amorphous silicon germanium (a-SiGe) layer 132, placed below the ohmic contact layer 133, which have the second thickness t2 which is smaller than the first thickness t1.

Figure 13D:
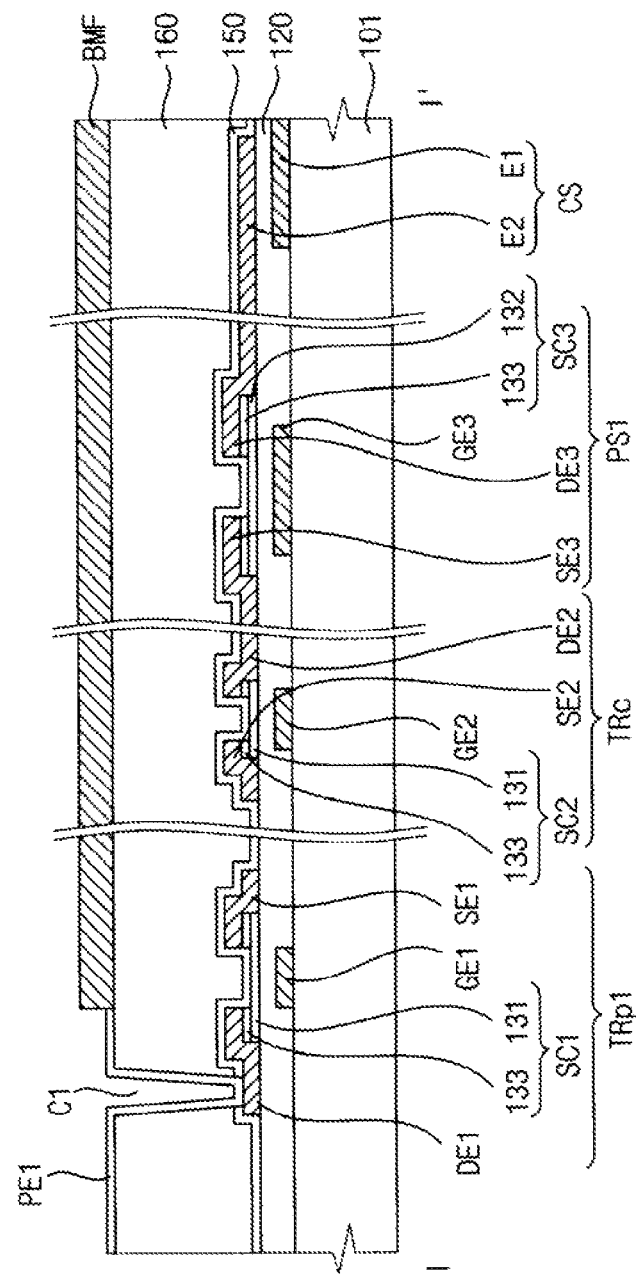

Referring to FIGS. 1 and 13D, a process of forming a source metal pattern, a protective layer 150, an organic insulating layer 160, contact holes C1, C2 and C3, a transparent electrode pattern and a light blocking filter pattern BMF on the first base substrate 101 on which the first, the second and the third semiconductor patterns SC1, SC2 and SC3 are formed, is substantially same as the process explained in FIG. 12D. Therefore, any further repetitive explanation concerning the above t will be omitted.

In case of manufacturing the first display substrate 100D by using the process according to the present embodiment, the processes of adding the active protective layer, etching the active protective layer to the active protective pattern and removing the active protective pattern may be omitted in still another embodiment (shown in FIGS. 12A and 12D) to simplify a manufacturing process.

Figure 14:
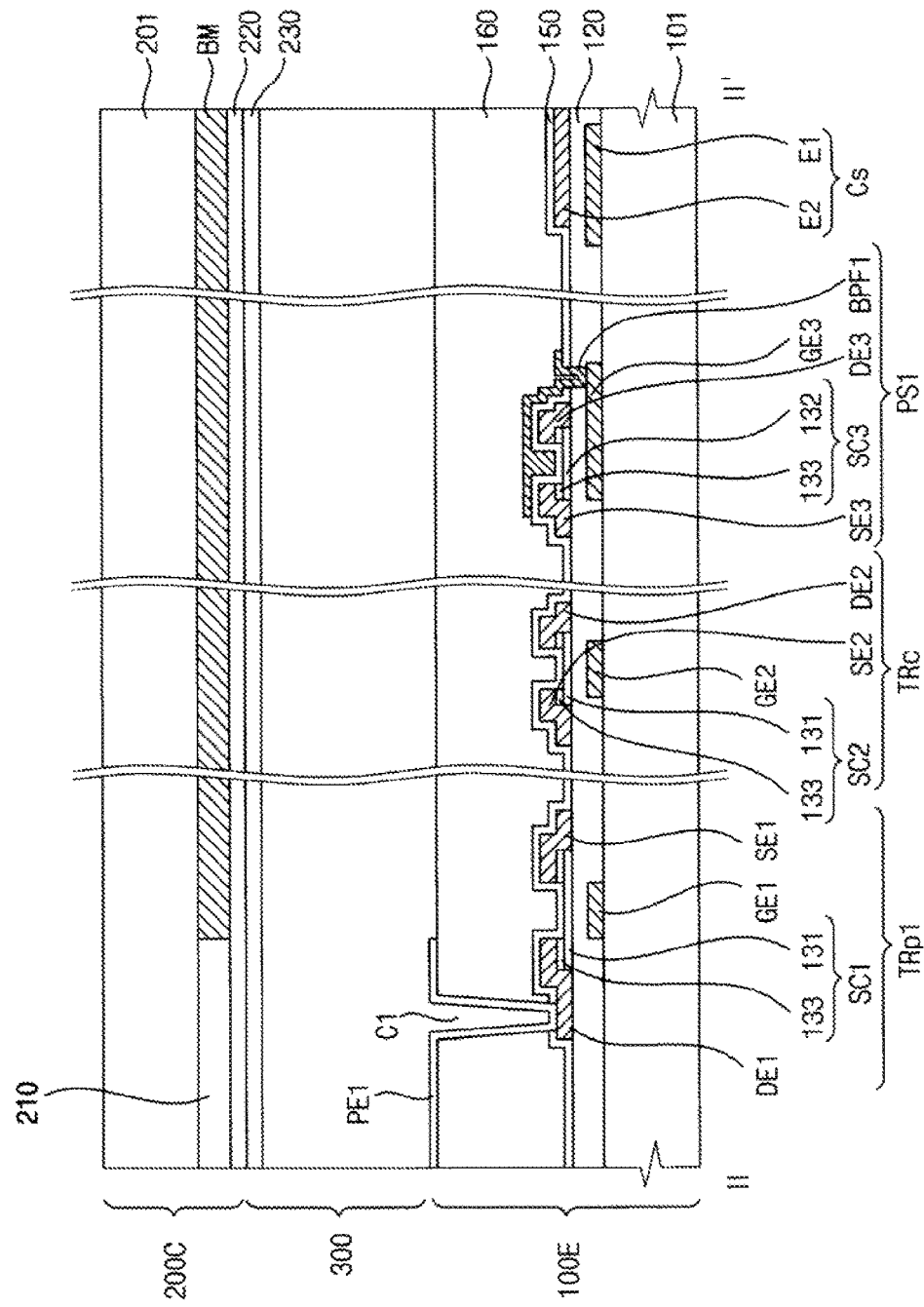
FIG. 14 is a cross-sectional view illustrating a touch-detecting display apparatus according to still another embodiment.

FIG. 14 is a cross-sectional view illustrating a touch-detecting display apparatus according to still another embodiment of the present disclosure.

Referring to FIGS. 7 and 14, the touch-detecting display apparatus includes a first display substrate 100E, a second display substrate 200C and a liquid crystal layer 300 disposed between the first display substrate 100E and the second display substrate 200C. According to the present embodiment, the touch-detecting display apparatus is substantially same as the touch-detecting display apparatus according to still another embodiment (shown in FIGS. 7 and 8) except for the structure of the first display substrate 100E. Thus, any further repetitive explanation concerning the other elements will be omitted.

The first display substrate 100E includes a first base substrate 101, a plurality of data lines DLm-2, DLm-1 and DLm, a plurality of reference lines RLk, a plurality of gate lines GLn, a plurality of bias lines BLn, a plurality of storage lines STLn and STLn+1, a first pixel switching element TRp1, a first pixel electrode PE1, a second pixel switching element TRp2, a second pixel electrode PE2, a third pixel switching element TRp3, a third pixel electrode PE3, a control switching element TRc, an infrared light sensing element IRS, a sensing capacitor Cs. Here, 'm', 'k', and 'n' are natural numbers. The first display substrate 100E is substantially same as the first display substrate 100D according to still another embodiment (shown in FIG. 11) except for the infrared light sensing element IRS which has local band pass filters (BPF) placed on its respective sections. Hereinafter, any further repetitive explanation concerning the other elements will be omitted.

The infrared light sensing element IRS includes a first light sensor PS1, a second light sensor PS2 and a third light sensor PS3, which are connected to each other, and the first, the second and the third light sensor PS1, PS2 and PS3 are arranged in the second direction D2 on an area adjacent to the gate line GLn.

The first light sensor PS1 includes a third gate electrode GE3, a third semiconductor pattern SC3, a third source electrode SE3, a third drain electrode DE3 and a first band pass filter BPF1. The third semiconductor pattern SC3 is disposed over the third gate electrode GE3, and includes an amorphous silicon germanium (a-SiGe) layer 132 and an ohmic contact layer 133. The third source electrode SE3 is partially overlapped with the third semiconductor pattern SC3, and the third drain electrode DE3 spaced apart from the third source electrode SE3 is partially overlapped with the third semiconductor pattern SC3. A channel of the first light sensor PS1 is defined by the amorphous silicon germanium (a-SiGe) layer 132 of the third semiconductor pattern SC3 exposed through a gap between the third source electrode SE3 and the third drain electrode DE3.

The first band pass filter BPF1 is disposed over the third source electrode SE3 and the third drain electrode DE3 to be overlapped with the third semiconductor pattern SC3. The first band pass filter BPF1 transmits a light having a predetermined wavelength, for example, in an infrared light band.

The first band pass filter BPF1 is conductive and electrically connected to the third gate electrode GE3 of the first light sensor PS1 through a fourth contact hole C4. The first light sensor PS1 may thus have a dual gate structure.

Although not shown, each of the second light sensor PS2 and the third light sensor PS3 may include a third semiconductor pattern SC3 having the amorphous silicon germanium (a-SiGe) layer 132 and the ohmic contact layer 133 like the third semiconductor pattern SC3 of the first light sensor PS1. In addition, each of the second light sensor PS2 and the third light sensor PS3 may have a dual gate structure having a second band pass filter BPF2 and a third band pass filter BPF3 connected to a third gate electrode GE3 through a fourth contact hole C4 like the first light sensor PS1.

Figure 15A:
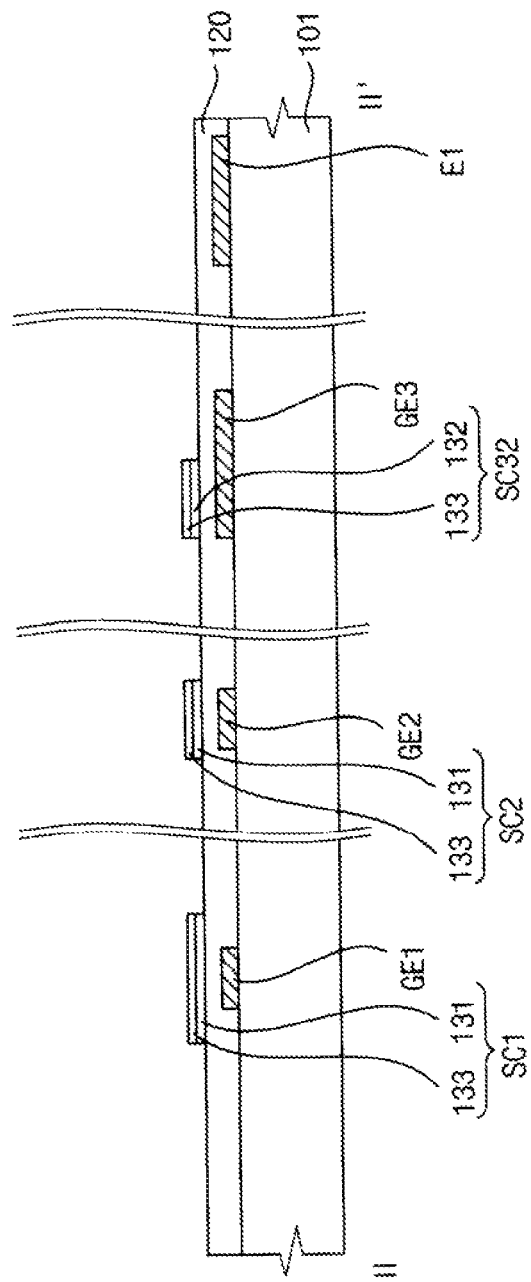
FIGS. 15A, 15B, and 15C are cross-sectional views for explaining a method of manufacturing a first display substrate of FIG. 14.
Figure 15B:
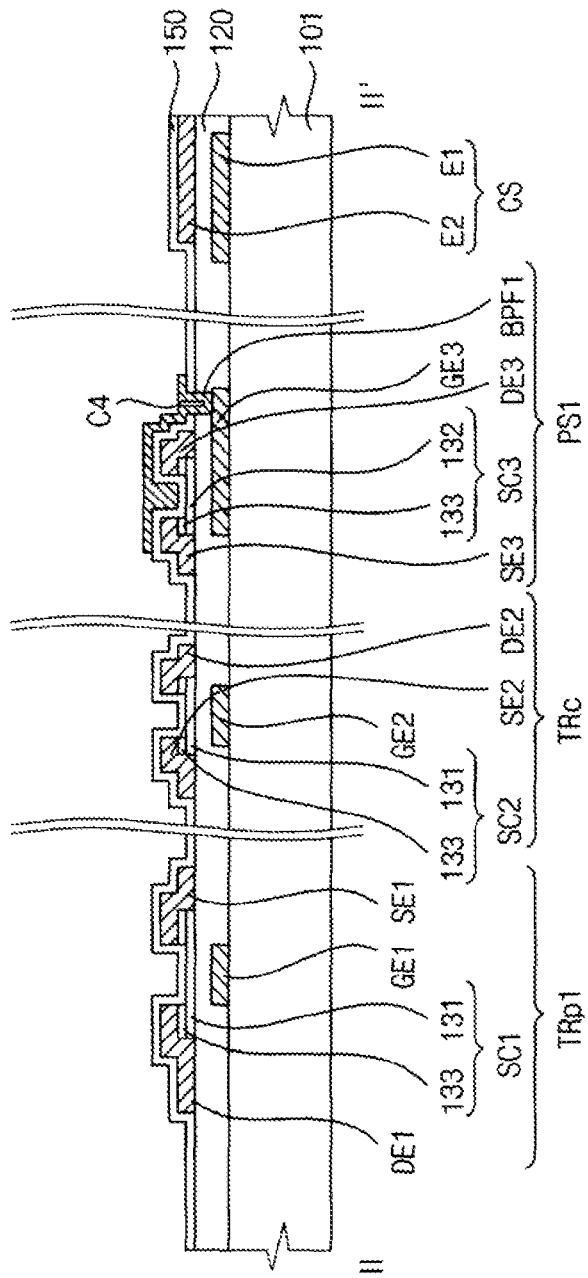
Figure 15C:
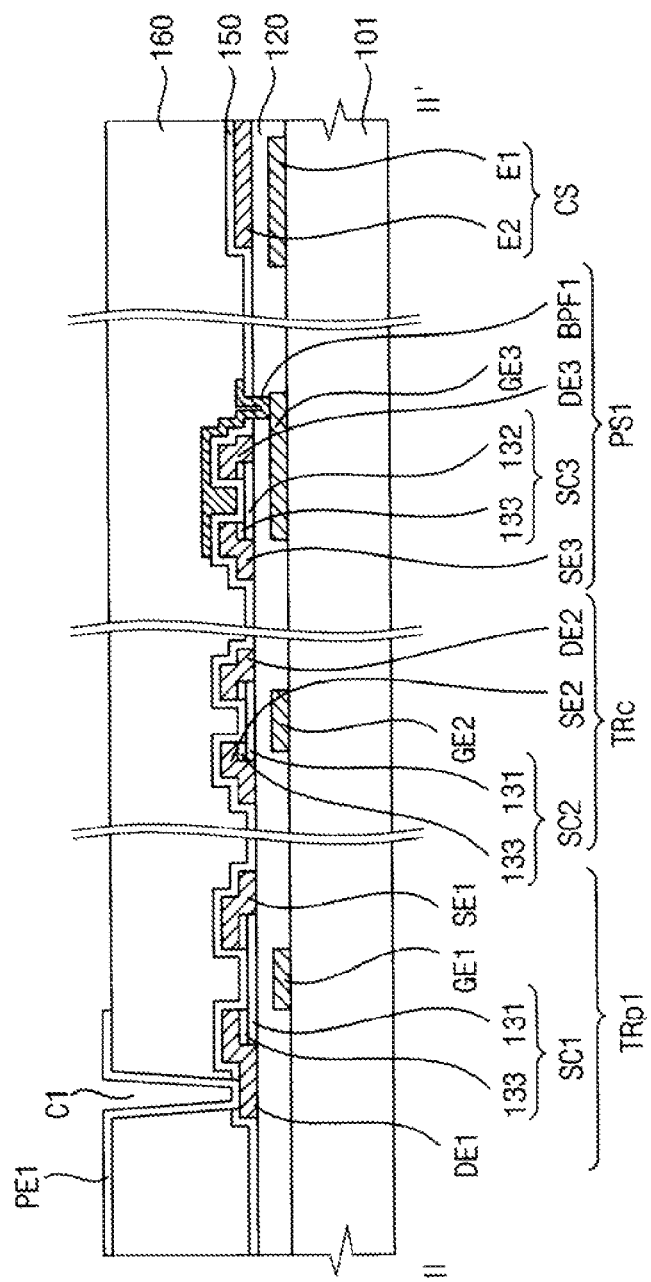

FIG. 15A to FIG. 15C are cross-sectional views for explaining a method of manufacturing the first display substrate of FIG. 14.

Referring to FIGS. 7, 14 and 15A, a gate metal layer is formed on the first base substrate 101. The gate metal layer is patterned to form a gate metal pattern by using a corresponding photoresist pattern. The gate metal pattern includes gate lines GLn, storage lines STLn and STLn+1, bias lines BLn, a first gate electrode GE1, a second gate electrode GE2 and a third gate electrode GE3.

A first semiconductor pattern SC1, a second semiconductor pattern SC2 and a third semiconductor pattern SC3 is formed on the first base substrate 101 on which the gate metal pattern is formed. The first and the second semiconductor patterns SC1 and SC2 include an amorphous silicon (a-Si) layer 131 and an ohmic contact layer 133, and the third semiconductor pattern SC3 includes an amorphous silicon germanium (a-SiGe) layer 132 and an ohmic contact layer 133.

A process of forming the first, the second and the third semiconductor patterns SC1, SC2 and SC3 is substantially same as the process (shown in FIGS. 12A and 12B, or in FIGS. 13A and 13B) according to still another embodiment, and any further repetitive explanation will be omitted.

Referring to FIGS. 7, 14 and 15B, a source metal pattern and a protective layer 150 are formed on the first base substrate 101 on which the first, the second and the third semiconductor patterns SC1, SC2 and SC3 are formed.

Using a mask, the protective layer 150 and the gate insulating layer 120 spaced beneath the protective layer 150 are etched to form a fourth contact hole C4. The third gate electrode GE3 is exposed through the fourth contact hole C4.

A band pass filter layer is formed on the protective layer 150 on which the fourth contact hole C4 is formed. The band pass filter layer includes a material selectively transmitting a light having a predetermined wavelength, for example, in the infrared light band. The band pass filter layer is patterned to form the first, the second and the third band pass filters BPF1, BPF2 and BPF3 by using the photoresist pattern.

The first band pass filter BPF1 is disposed on the third semiconductor pattern SC3 of the first light sensor PS1 and is connected to the third gate electrode GE3 of the first light sensor PS1 through the fourth contact hole C4. The second band pass filter BPF2 is disposed over the third semiconductor pattern SC3 of the second light sensor PS2 and is connected to the third gate electrode GE3 of the second light sensor PS2 through the fourth contact hole C4. The third band pass filter BPF3 is disposed over the third semiconductor pattern SC3 of the third light sensor PS3 and is connected to the third gate electrode GE3 of the third light sensor PS3 through the fourth contact hole C4. Therefore, each of the first, the second and the third light sensors PS1, PS2 and PS3 has a dual gate structure.

Referring to FIGS. 7, 14 and 15C, an organic insulating layer 160 is disposed on the first base substrate 101 on which the first, the second and the third light sensors PS1, PS2 and PS3 are formed. The organic insulating layer 160 is etched to form opening patterns corresponding to the first, the second and the third contact holes. The organic insulating layer 160 is also planarized.

Using the organic insulating layer 160 having the opening pattern as a mask, and the first, the second and the third contact holes C1, C2 and C3 are formed by etching the protective layer 150 and the gate insulating layer 120 placed beneath the protective layer 150 exposed through the opening pattern. A transparent conductive layer is disposed on the first base substrate 101 on which the first, the second and the third contact holes C1, C2 and C3 are formed. The transparent conductive layer is patterned to form a transparent conductive pattern by using the photoresist pattern. The transparent conductive pattern includes a first pixel electrode PE1, a second pixel electrode PE2, a third pixel electrode PE3, a first contact electrode CE1 and a second contact electrode CE2.

According to the present embodiment, a third semiconductor pattern SC3, a band pass filter BPF and the fourth contact hole C4 connecting the band pass filter BPF to the third gate electrode GE3 may be formed with the pixel switching element TRp1 and the pixel electrode PE so that a light sensing element and a control switching element to detect an outer touch are formed. Therefore, a manufacturing process may be simplified with compared to a conventional process to provide a touch position panel.

Figure 16:
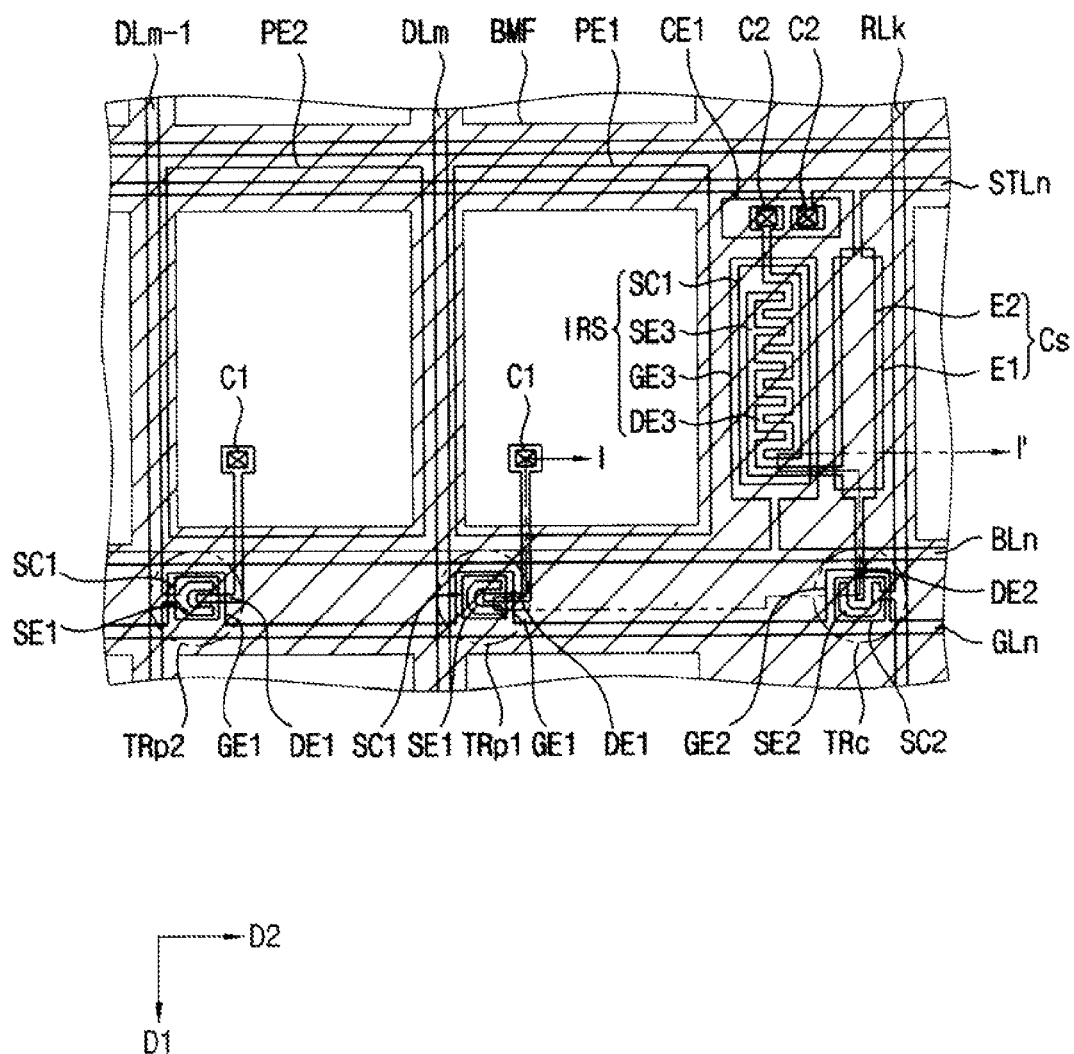
FIG. 16 is a plan view illustrating a touch-detecting display apparatus according to still another embodiment.

FIG. 16 is a plan view illustrating a touch-detecting display apparatus according to still another embodiment of the present disclosure.

Referring to FIG. 16, although not shown, the touch-detecting display apparatus includes a first display substrate, a second display substrate, a liquid crystal layer disposed between the first display substrate and the second display substrate. According to the present embodiment, the touch-detecting display apparatus may have a layered structure which is roughly the same as the touch-detecting display apparatuses according to the embodiments explained with reference to FIGS. 1 to 6 and 11 to 13. However, as seen in the plan view of FIG. 16 showing the touch-detecting display apparatus according to the present embodiment, the infrared light sensing element IRS is placed on a different position from the embodiments explained with reference to FIGS. 1 to 6 and 11 to 13.

As shown in FIG. 16, according to the present embodiment, the touch-detecting display apparatus includes a plurality of data lines (DLm-1, DLm), a plurality of reference lines RLk, a plurality of gate lines GLn, a plurality of bias lines BLn, a plurality of storage lines STLn and STLn+1, a first pixel switching element TRp1, a first pixel electrode PE1, a second pixel switching element TRp2, a second pixel electrode PE2, a control switching element TRc, an infrared light sensing element IRS, a sensing capacitor Cs and a light blocking filter pattern (BMF: Black-Matrix/Band-Pass-Filter). Here, 'm', 'k', and 'n' are natural numbers.

The data lines (DLm-1, DLm) extend in a first direction D1, and are arranged in a second direction D2 crossing the first direction D1.

The reference lines RLk extend in the first direction D1, and are arranged in the second direction D2. The reference lines RLk may be disposed between at least one of the data lines.

The gate lines GLn extend in the second direction D2, and are arranged in the first direction D1.

The bias lines BLn extend in the second direction D2, and are arranged in spaced apart fashion along the first direction D1. Each of the bias lines BLn may be disposed adjacent to a gate line.

The storage lines STLn extend in the second direction D2.

The first pixel switching element TRp1 includes a first gate electrode GE1, a first semiconductor pattern SC1, a first source electrode SE1 and a first drain electrode DE1. The first gate electrode GE1 is connected to an n-th gate line GLn and the first semiconductor pattern SC1 is disposed on the first gate electrode GE1. The first source electrode SE1 is connected to an M-th data line DLm, and is partially overlapped with the first semiconductor pattern SC1. The first drain electrode DE1 is connected to the first pixel electrode PE1 through a first contact hole C1 and is partially overlapped with the first semiconductor pattern SC1.

The second pixel switching element TRp2 includes a first gate electrode GE1, a first semiconductor pattern SC1, a first source electrode SE1 and a first drain electrode DE1. The first gate electrode GE1 is connected to an n-th gate line GLn and the first semiconductor pattern SC1 is disposed on the first gate electrode GE1. The first source electrode SE1 is connected to an (m−1)-th data line DLm-1, and is partially overlapped with the first semiconductor pattern SC1. The first drain electrode DE1 is connected to the second pixel electrode PE2 through a first contact hole C1 and is partially overlapped with the first semiconductor pattern SC1.

The control switching element TRc includes a second gate electrode GE2, a second semiconductor pattern SC2, a second source electrode SE2 and a second drain electrode DE2. The second gate electrode GE2 is connected to an n-th gate line GLn, and the second semiconductor pattern SC2 is disposed on the second gate electrode GE2. The second source electrode SE2 is connected to a reference line RLk, and is partially overlapped with the second semiconductor pattern SC2. The second drain electrode DE2 is connected to the infrared light sensing element IRS and is partially overlapped with the second semiconductor pattern SC2.

The infrared light sensing element IRS has a shape extending somewhat in the first direction D1 where the sensing capacitor Cs extends somewhat adjacent thereto and also in the first direction D1. The infrared light sensing element IRS includes a third gate electrode GE3, a third semiconductor pattern SC3, a third source electrode SE3 and a third drain electrode DE3. The third gate electrode GE3 is connected to the n-th bias line BLn. The third semiconductor pattern SC3 is disposed on the third gate electrode GE3. The third source electrode SE3 is connected to the second drain electrode DE2 of the control switching element TRc. The third drain electrode DE3 is connected to a first contact electrode CE1 through the storage line STLn and second contact holes C2.

The sensing capacitor Cs includes a first electrode E1 connected to the storage line STLn, a second electrode E2 connected to the third drain electrode DE3 of the infrared light sensing element IRS.

The light blocking filter pattern BMF is disposed on an area on which a metal pattern is formed and functions as a blocking pattern to block a visible light, and is disposed on an area on which the third semiconductor pattern SC3 of the infrared light sensing element is formed and at least there functions as a band pass filter BPF to selectively transmit a light having a predetermined wavelength, in other words, an infrared light. For example, the light blocking filter pattern BMF is disposed on an area on which the data lines DLm-2, DLm-1 and DLm, the gate lines GLn, the pixel switching elements TRp1, TRp2 and TRp3, the control switching element TRc are formed.

According to the present embodiment, the first display substrate may be made by a variety of the manufacturing methods explained in embodiments explained with reference to FIGS. 1 to 6 and 11 to 13.

Figure 17:
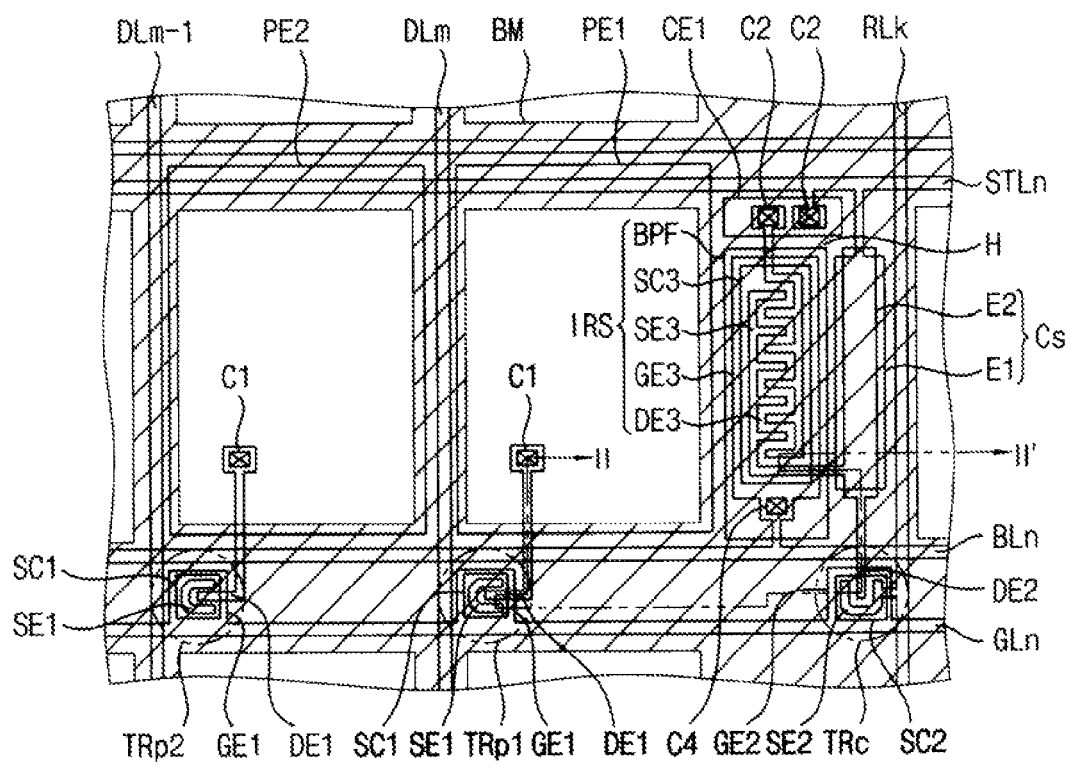
FIG. 17 is a plan view illustrating a touch-detecting display apparatus according to still another embodiment.

FIG. 17 is a plan view illustrating a touch-detecting display apparatus according to still another embodiment of the present invention.

Referring to FIG. 17, although not shown, the touch-detecting display apparatus includes a first display substrate, a second display substrate, a liquid crystal layer disposed between the first display substrate and the second display substrate. According to the present embodiment, the touch-detecting display apparatus may have a layered structure which is substantially same as the touch-detecting display apparatuses according to the embodiments explained with reference to FIGS. 7 to 10 and 14 to 15. However, in a plan view of the touch-detecting display apparatus according to the present embodiment, an infrared light sensing element IRS has a shape extending in the first direction D1 like the embodiment illustrated in FIG. 16.

According to the present embodiment, an infrared light sensing element IRS formed on the first display substrate is that a band pass filter BPF is formed on a third semiconductor pattern SC3, and the band pass filter BPF is connected to a third gate electrode GE3 through a fourth contact hole C4. The infrared light sensing element IRS has a dual gate structure. A blocking light pattern BM formed on a second display substrate is disposed on an area on which data lines DLm-2, DLm-1 and DLm, gate lines GLn, pixel switching elements TRp1, TRp2 and TRp3, a control switching element TRc and light sensors PS1, PS2 and PS3 are formed.

According to the present embodiment, the first display substrate may be made by the various manufacturing methods explained in embodiments 3 and 6.

The foregoing is illustrative of the present disclosure of invention and is not to be construed as limiting thereof. Although a few embodiments in accordance with the present teachings have been described, those skilled in the art will readily appreciate from the foregoing that many modifications are possible in the embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative and is not to be construed as limited to the specific embodiments disclosed, and that modifications to the disclosed embodiments, as well as other embodiments, are intended to be included within the scope of the teachings.

What is claimed is:

1. A display substrate comprising:
a pixel switching element connected to a respective elongated data line and to a respective elongated gate line which crosses with the data line, where the gate line, data line and pixel switching element are formed on a base substrate and where the pixel switching element includes a first semiconductor pattern;
a pixel electrode electrically connected to the pixel switching element;
a reference line extending parallel with the data line;
a control switching element connected to the reference line and to the gate line, and including a second semiconductor pattern;
a bias line extending parallel with the gate line;
a light sensing element connected to the bias line and the control switching element, and including a third semiconductor pattern;
an electrically conductive band pass filter formed substantially on top of the third semiconductor pattern and structured to selectively transmit a prespecified infrared wavelength to the third semiconductor pattern; and
a sensing capacitor connected to the light sensing element and to a storage line.

2. The display substrate of claim 1, wherein the light sensing element is a field effect device that comprises a gate electrode connected to the bias line, and where the band pass filter is electrically connected to the gate electrode.

3. The display substrate of claim 1, wherein each of the first, second and third semiconductor patterns comprises an amorphous silicon (Si) layer, an amorphous silicon germanium (SiGe) layer and an ohmic contact layer.

4. The display substrate of claim 1, wherein each of the first and second semiconductor patterns comprises an amorphous silicon layer and an ohmic contact layer, and the third semiconductor pattern comprises an amorphous silicon germanium layer and an ohmic contact layer.

5. The display substrate of claim 1, wherein the light sensing element is disposed to extend along an extending direction of the elongated gate line.

6. The display substrate of claim 5, wherein the light sensing element comprises at least one light sensor disposed between the data lines.

7. The display substrate of claim 1, wherein the light sensing element is disposed to extend along an extending direction of the data line.

8. A method of manufacturing a display substrate, the method comprising:
forming a gate metal pattern comprising a gate line, first and second gate electrodes, a bias line, a third gate electrode and a storage line on a base substrate, the first and second gate electrodes being connected to the gate line, the third gate electrode and the storage line being connected to the bias line;
forming a first semiconductor pattern over the first gate electrode, a second semiconductor pattern over the second gate electrode, and a third semiconductor pattern over the third gate electrode;
forming a source metal pattern comprising a data line, first source and drain electrodes, a reference line, second source and drain electrodes, third source and drain electrodes and an electrode on the base substrate on which the first, second and third semiconductor patterns are formed, the first source and drain electrodes overlapping with the first semiconductor pattern, the second source and drain electrodes overlapping with the second semiconductor pattern, the third source and drain electrodes overlapping with the third semiconductor pattern, the electrode partially overlapping with the storage line;
forming a pixel electrode electrically connected to the first drain electrode, and a contact electrode electrically connecting the third drain electrode to the storage line; and
forming an electrically conductive band pass filter overlapping with the third semiconductor pattern and electrically connected to the third gate electrode, where the band pass filter is structured to selectively transmit therethrough an infrared light of predetermined wavelength.

9. The method of claim 8, wherein forming the first, second and third semiconductor patterns comprises:
forming a gate insulating layer on the base substrate on which the gate metal pattern is formed;
forming an amorphous silicon layer, an amorphous silicon germanium layer and an ohmic contact layer on the gate insulating layer; and
patterning the amorphous silicon layer, the amorphous silicon germanium layer and the ohmic contact layer to thereby form the first, second and third semiconductor patterns.

10. The method of claim 9, further comprising:
selectively removing the ohmic contact layer and the amorphous silicon germanium layer of the first and second semiconductor patterns, and the ohmic contact layer of the third semiconductor pattern, using the source metal pattern as a removal mask.

11. The method of claim 8, wherein forming the first, second and third semiconductor patterns comprises:
forming a gate insulating layer on the base substrate on which the gate metal pattern is formed;
forming an amorphous silicon germanium layer, an ohmic contact layer and an active protective layer on the gate insulating layer;
patterning the amorphous silicon germanium layer, the ohmic contact layer and the active protective layer to thereby form the third semiconductor pattern and an active protective pattern on the third semiconductor pattern;
forming an amorphous silicon layer and an ohmic contact layer on the base substrate on which the third semiconductor pattern and the active protective pattern are formed;
patterning the amorphous silicon layer and the ohmic contact layer to thereby form the first and second semiconductor patterns; and
selectively removing the active protective pattern formed on the third semiconductor pattern.

12. The method of claim 11, further comprising:
selectively removing the ohmic contact layer of the first, second and third semiconductor patterns using the source metal pattern as a removal mask.

13. The method of claim 8, wherein forming the first, second and third semiconductor patterns comprises:
forming a gate insulating layer on the base substrate on which the gate metal pattern is formed;
forming an amorphous silicon germanium layer and an ohmic sacrificial layer on the gate insulating layer, the ohmic sacrificial layer having a first thickness;
patterning the amorphous silicon germanium layer and the ohmic sacrificial layer to thereby form a preliminary semiconductor pattern;
forming an amorphous silicon layer and an ohmic contact layer on the base substrate on which the preliminary semiconductor pattern is formed, the ohmic contact layer having a second thickness smaller than the first thickness; and
etching the amorphous silicon layer and the ohmic contact layer to thereby form the first and second semiconductor patterns, and partially etching the ohmic sacrificial layer of the preliminary semiconductor pattern to form an ohmic contact layer of the third semiconductor pattern.

14. The method of claim 13, further comprising:
removing the ohmic contact layer of the first, second and third semiconductor patterns using the source metal pattern as a removal mask.

15. A touch-detecting display apparatus comprising:
a first display substrate including a pixel switching element, a pixel electrode, a reference line, a control switching element, a bias line, a storage line, a light sensing element and a sensing capacitor, the pixel switching element being connected to data and gate lines crossing each other and formed on a first base substrate and including a first semiconductor pattern, the pixel electrode being electrically connected to the pixel switching element, the reference line being elongated in parallel with the data line, the control switching element being connected to the reference line and the gate line and including a second semiconductor pattern, the bias line being elongated in parallel with the gate line, the light sensing element being connected to the bias line and the control switching element and including a third semiconductor pattern, the sensing capacitor being connected to the light sensing element and to the storage line;
a light blocking filter pattern disposed over the light sensing element and structured to selectively transmit light of a first predetermined wavelength to the light sensing element, and the light blocking filter pattern being disposed over the data and gate lines and structured to block light of a second predetermined wavelength different from the first wavelength from escaping from areas of the data and gate lines, the light blocking filter pattern being patterned around the pixel electrode to allow the light of the second predetermined wavelength to pass through the pixel electrode;
a second display substrate including a common electrode disposed on a second base substrate facing the first base substrate; and
a liquid crystal material layer interposed between the first display substrate and the second display substrate.

16. The touch-detecting display apparatus of claim 15, wherein the first display substrate further comprises an organic insulating layer disposed on the base substrate to cover and seal in the pixel switching element, the control switching element and the light sensing element,
wherein the light blocking filter pattern is disposed on the organic insulating layer.

17. The touch-detecting display apparatus of claim 15, wherein the light blocking filter pattern is disposed on the second base substrate.

18. The touch-detecting display apparatus of claim 15, wherein the first, second and third semiconductor patterns respectively comprise an amorphous silicon layer, an amorphous silicon germanium layer and an ohmic contact layer.

19. The touch-detecting display apparatus of claim 15, wherein the first and second semiconductor patterns respectively comprises an amorphous silicon layer and ohmic contact layer but not a SiGe layer, and the third semiconductor patter comprises an amorphous silicon germanium layer and the ohmic contact layer but not a Si layer.

* * * * *